United States Patent [19]

Yoshizawa et al.

[11] Patent Number: 4,994,345

[45] Date of Patent: Feb. 19, 1991

[54] IMAGE FORMING METHOD FOR FORMING A MULTICOLOR IMAGE FROM A HALF-TONE DOT EXPOSURE

[75] Inventors: Tomomi Yoshizawa; Keiji Ogi; Nariko Kimura, all of Hino, Japan

[73] Assignee: Konica Corporation, Tokyo, Japan

[21] Appl. No.: 361,264

[22] Filed: Jun. 5, 1989

[30] Foreign Application Priority Data

Jun. 13, 1988 [JP] Japan ............................... 63-146096

[51] Int. Cl.$^5$ .......................... G03C 7/00; G03C 7/10; G03C 7/30

[52] U.S. Cl. ................................ 430/264; 430/265; 430/268; 430/358; 430/356; 430/293; 430/464; 430/467; 430/470; 430/475; 430/484; 430/510; 430/556; 430/557

[58] Field of Search ............... 430/264, 265, 268, 464, 430/467, 510, 556, 557, 293, 356, 358, 470, 475

[56] References Cited

U.S. PATENT DOCUMENTS

| 4,254,213 | 3/1981 | Masuda et al. | 430/548 |
|---|---|---|---|
| 4,705,745 | 11/1987 | Kitchin et al. | 430/505 |
| 4,910,126 | 3/1990 | Sato et al. | 430/546 |

FOREIGN PATENT DOCUMENTS

| 75448 | 4/1987 | Japan | 430/264 |
|---|---|---|---|
| 75449 | 4/1987 | Japan | 430/264 |
| 109055 | 5/1987 | Japan . | |

OTHER PUBLICATIONS

Research Disclosure RD17643, "Photographic Silver Halide Emulsions, Preparations, Addenda, Processing and Systems,"12/78, pp. 22–31.

Primary Examiner—Paul R. Michl
Assistant Examiner—Patrick Doody
Attorney, Agent, or Firm—Jordan B. Bierman

[57] ABSTRACT

A method for making a color proof in a photo-mechanical process. The method comprises a step for exposing a silver halide color photographic light-sensitive material to light through a black-and-white halftone dot image, and a step for developing said silver halide color photographic light-sensitive material with a color developer. The photographic material is comprised of at least three silver halide emulsion layers which are different from each other in spectral sensitivity thereof, and at least one of these silver halide emulsion layers contains a specific yellow coupler and the color developer contains a specific color developing agent. A halftone color image having a color tone similar to that of image printed with printing inks can be obtained by the simplified process.

7 Claims, No Drawings

IMAGE FORMING METHOD FOR FORMING A MULTICOLOR IMAGE FROM A HALF-TONE DOT EXPOSURE

FIELD OF THE INVENTION

This invention relates to an image-forming method on a silver halide color photographic light-sensitive material applicable for forming a color image for proofreading use, i.e., a color proof, from a color separated black-and-white halftone-dot image in a photo-mechanical process.

BACKGROUND OF THE INVENTION

In the field of graphic arts, a number of graphic arts films are used for color separation, composing images, and so forth, in the step of making a printing plate having thereon a halftone-dot image formed from a continuous tone image on a reversal film, color negative film, color paper, or the like. This makes the working be so complicated that so many errors such as erroneous lettering, layouts and so forth cannot be avoided.

Furthermore, various amendments of lettering, layouts, coloring and so forth are very often requested separately by many customers. Therefore, some of such corrections are liable to overlooking. It is also necessary to make an advance check on whether or not a printed matter could be finished to meet the requirements of color tone and gradation. The checking procedures for the above are generically called a proofreading.

For the purpose of making confirmation of this kind of proofreading, not only a test proofing so-called a proof print but also a variety of systems have been made public and available on the market. These systems include, for example, those using a CRT, those using non-silver salt light-sensitive materials comprising a photopolymer, diazo compound or the like, those forming an image with dry-type toner, those of the electrophotographic proofreading types, and so forth. However, according to these proofreading systems, there have been general problems such as a long time required to finish a proof sheet, an expensive material cost, a poor workability, and so forth. It has therefore been the present situations that these proofreading systems have not satisfactorily been put into practice.

Besides the above, as for the other systems of obtaining a proof, there is a system in which a color-separated halftone original document is printed on a color light-sensitive material through spectorally separated light. These systems include, for example, such a method in which a proof is obtained on a color light-sensitive material through a photographing system by making use of a projection lens, disclosed in Japanese Patent Publication Open to Public Inspection—hereinafter referred to as Japanese Patent O.P.I. Publication—Nos. 60-4276/1985, 62-280746/1987, 62-280747/1987, 62-280748/1987, 62-280749/1987, 62-280750/1987 and 62-280849/1987, and so forth' or the contact-exposure systems being marketed under the trade names of 'The Carlson Proofmaster System' and 'Color Proofing System' marketed by Chesley F. Carlson Co. and Kreonite, Inc., respectively.

In either system, a positive or negative type silver halide color photographic light-sensitive material is used. Therefore, these systems have excellent characteristics superior to those of the other proofreading systems, because a color proofing can be performed much faster in time and lower in cost, as compared with the other systems.

In these systems, a color original picture is so color-separated as to be converted into a plurality of halftone-dot black-and-white images. The resulted color-separated black-and-white halftone dot images are printed one after another on a sheet of color paper in a contact-printing method, for example. The printed color paper is treated in a color developing process, and a color image is formed with the dyes produced imagewise out of couplers in the color developing process. The resulting color image is used as an image for proofreading use.

Among the methods of forming images for proofreading use, there is also a well-known method in which a silver dye bleaching process is used, besides the above-given methods in which dye images are formed in a color development process. However, the silver dye bleaching process has such a defect as a processing unstability. Therefore, this method is not preferable for a method of forming images for proofreading use for which constant, stable and high quality images are required.

From this point of view, it can be said that a silver halide color photographic light-sensitive material in which color images can be formed upon coupling reaction of a coupler with an aromatic primary amine type developing agent is excellent to meet the above-mentioned requirements, because this light-sensitive material can provide stable images.

Color paper used in such a method as described above is required to provide a color coupler image with a hue closely approximate to the hue of a color print image. However, this technical requirement has not been satisfied yet. To cope with the above-mentioned problems, Japanese Patent O.P.I. Publication No. 62-109055/1987, for example, discloses a method in which, when an exposure is made through a magenta-separated negative, a green-light exposure is made and, at the same time, a blue-light exposure is additively made, so that a resulting tone may be made close to that of a printed matter. Even in this method, as described in this patent specification, a satisfactory close tone may not be obtained even if an ordinary type color paper is used and an exposure is so adjusted.

Also, in this method, even if the tone could be made close to that of the printed matter in specific portions, i.e., a specific half-tone dot area, from the highlight to the shadow of a halftone-dot image, it cannot be said that the characteristics required for a color-proof are satisfied. Further, in order to obtain a color-proof image having a more closer tone, it is required to obtain a color image having a more closer tone in every area from the highlight portions to the shadow portions.

SUMMARY OF THE INVENTION

It is an object of the invention to provide an image forming method on a silver halide color photographic light-sensitive material which is applicable to the above-described color-proof making system and capable of providing a hue improved in the degree of approximation to that of the hue of a printed image.

Another object of the invention is to provide an image forming method on a silver halide color photographic light-sensitive material capable of obtaining a tone closer to that of the yellow image of a printed matter in a wide range from the highlight portions to the shadow portions.

The objects of the invention can be achieved with an image forming method comprising a step for exposing a silver halide color photographic light-sensitive material which comprises at least three silver halide emulsion layers being different from each other in spectral sensitivity thereof, and at least one of the silver halide emulsion layers contains an yellow coupler represented by the following Formula I, to light through black-and-white halftone dot images, and a step for developing the silver halide color photographic light-sensitive material, after the exposing step, with a color developer containing a color developing agent represented by the following Formula IV:

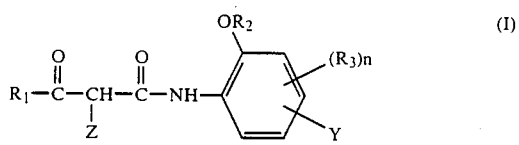

wherein $R_1$ represents an alkyl group or a cycloalkyl group; $R_2$ represents an alkyl group, a cycloalkyl group, an acyl group or an aryl group; $R_3$ represents a group substitutable with a benzene ring; n is an integer of zero or 1; Y represents a mono-valent ballast group and Z represents a hydrogen atom or a group capable of being split off upon coupling reaction,

wherein $R_{21}$ and $R_{22}$ represent each an alkyl group provided that $R_{21}$ and $R_{22}$ may be the same or different from each other, and $R_{21}$ and $R_{22}$ may be bound together to complete a ring.

DETAILED DESCRIPTION OF THE INVENTION

Silver halide color photographic light-sensitive materials relating to the invention are comprised of at least three layers each having a different spectral sensitivity.

The light-sensitive materials preferably applicable to the invention include, for example; those capable of forming a positive image from positive black-and-white halftone-dot images.

Next, the couplers relating to the invention each represented by Formula I will be detailed.

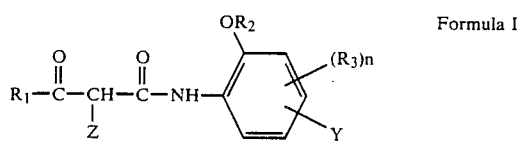

wherein $R_1$ represents an alkyl group or a cycloalkyl group; $R_2$ represents an alkyl group, a cycloalkyl group, an acyl group or an aryl group; $R_3$ represents a group substitutable for in a benzene ring; n is an integer of 0 or 1; Y represents a monovalent ballast group; and Z represents a hydrogen atom or a group capable of being split in a coupling reaction.

In Formula I, the alkyl groups represented by $R_1$ may be either straight-chained or branched and they include, for example, a methyl group, an ethyl group, an isopropyl group, a t-butyl group, a dodecyl group and so forth. These alkyl groups further include those each having a substituent. Such substituents include, for example, a halogen atom and each group of aryl, alkoxy, aryloxy, alkylsulfonyl, acylamino, alkoxy, hydroxy and so forth.

The cycloalkyl groups represented by $R_1$ include, for example, those of cyclopropyl, cyclohexyl, adamantyl and so forth.

As for the groups represented by $R_1$, the branched alkyl groups should be preferable.

As for the alkyl and cycloalkyl groups represented by $R_2$, the same groups as those represented by $R_1$ may be given. As for the aryl groups include, for example, a phenyl group. The alkyl, cycloalkyl and aryl groups represented by $R_2$ further include those each having the same substituent as those given in the case of $R_1$. As for the acyl groups, each group of acetyl, propionyl, butyryl, hexanoyl, benzoyl and so forth may be given.

The groups represented by $R_2$ are preferably alkyl or aryl groups and, more preferably, alkyl groups.

There is no special limitation to $R_3$, provided they are substitutable for in a benzene ring. They include, more concretely, halogen atoms such as a chlorine atom, alkyl groups such as those of ethyl, i-propyl and t-butyl, alkoxy groups such as a methoxy group, aryloxy groups such as a phenyloxy group, acyloxy groups such as those of methylcarbonyloxy and benzoyloxy, acylamino groups such as those of acetamido and phenylcarbonylamino, carbamoyl groups such as those of N-methylcarbamoyl and N-phenylcarbamoyl, alkylsulfonamido groups such as an ethylsulfonylamido, arylsulfonamido groups such as a phenylsulfonylamino group, sulfamoyl groups such as those of N-propylsulfamoyl and N-phenylsulfamoyl, imido groups such as those of succinimido and glutarimido, and so forth.

In Formula I, Z represents a group which is split off in a coupling reaction with the oxidized products of a developing agent. These groups include, for example, those represented by the following Formulas IV or V.

  Formula IV wherein $R_{10}$ represents an aryl or heterocyclic group each including those having a substituent.

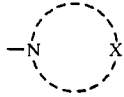  Formula V wherein X represents a group consisting of non-metal atoms necessary for completing a 5- or 6-membered ring in association with a nitrogen atom. Therein, the atomic group necessary for completing a group of non-metal atoms include, for example, methylene, methine, substituted methine,

—NH—, —N=, —O—, —S—, —SO$_2$—, and so forth.

The ballast groups each represented by Y are those for providing a non-diffusibility to a color dye. These groups include, for example, an organic group having not less than 8 to 30 carbon atoms. More preferable examples thereof include aliphatic groups and aromatic groups, such as an acyl group, a carbamoyl group, a sulfamoyl group, a sulfonamido group, an alkoxycarbonyl group, and so forth.

Further preferably, the ballast groups represented by Y include those represented by Formula J-R$_{11}$, wherein R$_{11}$ represents an organic group containing one bonding group having either a carbonyl unit or a sulfonyl unit.

The groups each having a carbonyl unit include, for example, an ester group, an amido group, a carbamoyl group, a ureido group, a urethane group and so forth. The groups each having a sulfonyl unit include, for example, a sulfon group, a sulfonamido group, a sulfamoyl group, an aminosulfonamido group, and so forth. J represents an —CO— group, an

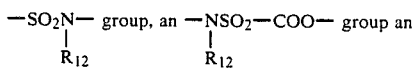

wherein R$_{12}$ represents a hydrogen atom, an alkyl group, an aryl group or a heterocyclic group.

Alkyl groups represented by R$_{12}$ include, for example, a methyl group, an ethyl group, an isopropyl group, a t-butyl group, a dodecyl group, and so forth. Aryl groups represented by R$_{12}$ include, for example, a phenyl group, a naphthyl group, and so forth.

Alkyl groups or aryl groups each represented by R$_{12}$ include those having a substituent. Such substituents may not be specially limitative, and the typical examples thereof include halogen atoms such as a chlorine atom and so forth, alkyl groups such as an ethyl group, a t-butyl group, aryl groups such as a phenyl group, a p-methoxyphenyl group, a naphthyl group and so forth, alkoxy groups such as an ethoxy group, a benzyloxy group and so forth, aryloxy groups such as a phenoxy group and so forth, alkylthio groups such as an ethylthio group and so forth, arylthio groups such as a phenylthio group and so forth, alkylsulfonyl groups such as a β-hydroxyethylsulfonyl group and so forth, arylsulfonyl groups such as a phenylsulfonyl group and so forth; acylamino groups including alkylcarbonylamino groups such as an acetoamido group and so forth, arylcarbonylamino groups such as a phenylcarbonylamino group and so forth; carbamoyl groups including those groups substituted with an alkyl group, an aryl groups such as a phenyl group, or the like and, more concretely, an N-methylcarbamoyl group, an N-phenylcarbamoyl group, and so forth; acyl group including alkylcarbonyl groups such as an acetyl group, arylcarbonyl groups such as a benzoyl group and so forth; sulfonamido groups such as an alkylsulfonylamino group, an arylsulfonylamino group and, more concretely, a methylsulfonylamino group, a benzenesulfonamido group and so forth; sulfamoyl groups including those groups substituted with an alkyl group, an aryl group such as a phenyl group, or the like and, more concretely, an N-methylsulfamoyl group, an N-phenylsulfamoyl group and so forth; and, further, a hydroxy group, a nitrile group and so forth.

Next, the yellow couplers represented by the above-given Formula I will be exemplified below.

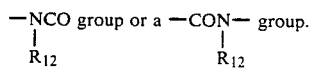

| No. | R$_1$ | R$_2$ | Z |
|---|---|---|---|
| I-1 | (t)C$_4$H$_9$— | —CH$_3$ | ![structure] |
| I-2 | (t)C$_4$H$_9$— | —CH$_3$ | ![structure] |
| I-3 | (t)C$_4$H$_9$— | —CH$_3$ | ![structure] |

-continued

| | | | |
|---|---|---|---|
| | | | R₁COCHCONH—[benzene with OR₂ at 3rd position, 4th, 5th, 6th positions labeled]<br>     \|<br>     Z | |
| I-4 | (t)C₄H₉— | —CH₃ | [hydantoin N-substituted with N-CH₂-phenyl and N-phenyl] |
| I-5 | (t)C₄H₉— | —CH₃ | [triazole with Cl] |
| I-6 | (t)C₄H₉— | —CH₃ | [OC₄H₉ substituted triazolinone with phenyl] |
| I-7 | (t)C₄H₉— | —C₃H₇(iso) | [OC₂H₅ substituted hydantoin with phenyl] |
| I-8 | (t)C₄H₉— | —CH₃ | —O—C₆H₄—SO₂—C₆H₄—OCH₂—C₆H₅ |
| I-9 | (t)C₄H₉— | —C₁₂H₂₅ | —O—C₆H₄—SO₂—C₆H₄—OH |
| I-10 | (t)C₄H₉— | —C₁₈H₃₇ | [imidazole with CONH-phenyl] |
| I-11 | (t)C₄H₉— | —CH₃ | [hydantoin with N-C₆H₁₃ and N-phenyl] |
| I-12 | (t)C₄H₉— | —C₄H₉ | [hydantoin with N-CH₂-phenyl] |

-continued

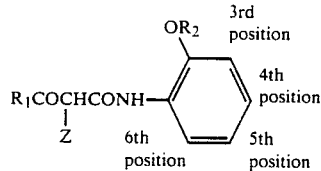

| | $R_1$ | $OR_2$ | Z (at positions shown) |
|---|---|---|---|
| I-13 | (t)C₄H₉— | —CH₃ | (hydantoin with N–CH₂–phenyl and N–phenyl) |
| I-14 | (t)C₄H₉— | —CH₃ | (triazole with Cl) |
| I-15 | (t)C₄H₉— | —CH₃ | (phthalimide) |
| I-16 | (t)C₄H₉— | —CH₃ | (N-sulfonyl tolyl, S–C₃H₇(iso)) |
| I-17 | C₂H₅OCH₂C(CH₃)₂— | —CH₃ | (tetrazole with p-tolyl) |
| I-18 | (t)C₄H₉— | —CH₃ | —O–C₆H₄–SO₂–C₆H₄–OCH₂–C₆H₅ |
| I-19 | (t)C₄H₉— | —CH₃ | —O–C₆H₄–COOC₂H₅ |
| I-20 | (t)C₄H₉— | —C₁₂H₂₅ | (triazine with OC₆H₁₃ and N–C₆H₄–Cl) |
| I-21 | (t)C₄H₉— | —C₂H₅ | (COOCH₃ substituted ring with NH) |

-continued

| | | | |
|---|---|---|---|
| I-22 | [phenyl-OC(CH₃)₂-] | —C₄H₉ | [imidazole with COOC₆H₁₃] |
| I-23 | (t)C₅H₁₁ | —C₂H₅ | H |
| I-24 | (t)C₄H₉— | —CH₃ | [triazole-morpholine] |
| I-25 | (t)C₄H₉— | —C₁₆H₃₃ | [bis(chlorophenyl)sulfone with OH and O—] |
| I-26 | (t)C₄H₉— | —CH₃ | [hydantoin with gem-dimethyl and N—CH₂OH] |
| I-27 | (t)C₄H₉— | —CH₃ | [triazolone with N—CH₃] |
| I-28 | (t)C₄H₉— | —CH₃ | [hydantoin with N—CH₂-p-tolyl and N-phenyl] |
| I-29 | [phenyl-C(CH₃)₂-] | —C₁₂H₂₅ | [imidazole with two COOC₂H₅ groups] |
| I-30 | (t)C₅H₁₁— | —CH₃ | [imidazolone with gem-dimethyl and NHCOCH₃] |

-continued
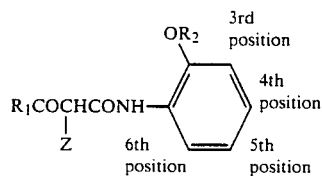
| | | | |
|---|---|---|---|
| I-31 | (t)C$_4$H$_9$— | —CH$_3$ | 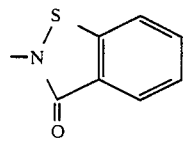 |
| I-32 | (t)C$_4$H$_9$— | —CH$_3$ | 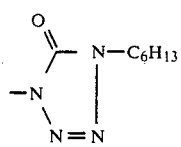 |
| I-33 | (t)C$_4$H$_9$— | —CH$_3$ | 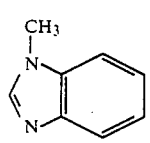 |
| I-34 | (t)C$_4$H$_9$— | 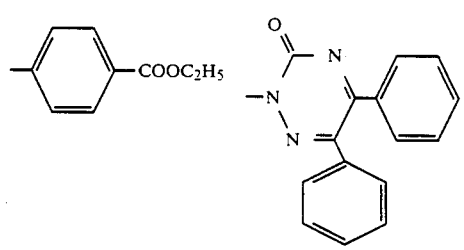 | |
| I-35 | (t)C$_4$H$_9$— | —C$_4$H$_9$ | 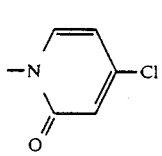 |
| I-36 | (t)C$_4$H$_9$— | —CH$_3$ | 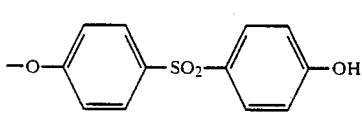 |
| I-37 | (t)C$_4$H$_9$— | 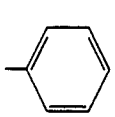 | 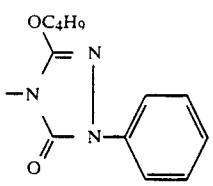 |
| I-38 | (t)C$_5$H$_{11}$ |  | 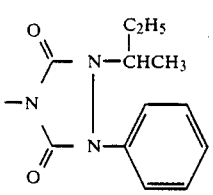 |

-continued

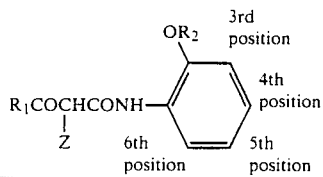

| | R₁ | Z | OR₂ (3rd position) | 4th/5th/6th position |
|---|---|---|---|---|
| I-39 | (t)C₄H₉— | —C(O)C₂H₅ | —CH₃ | (4th) hydantoin-type ring with —N, C=O, N-phenyl, and substituent CH(CH₂COOC₂H₅) |
| I-40 | (t)C₄H₉— | —CH₃ | | (4th) 1,2,4-triazoline-3-one with OC₂H₅, =N, N-benzyl |
| I-41 | (t)C₄H₉— | —CH₃ | | (4th) N-O ring with C(=O)-phenyl |
| I-42 | (t)C₄H₉— | —CH₃ | | (4th) triazolidinedione, N—C₂H₅, N—CH₂-phenyl |
| I-43 | (t)C₄H₉— | —CH₃ | | (4th) —O-phenyl with ortho CONH(CH₂)₂OH |
| I-44 | C₆H₅—SO₂CH₂C(CH₃)₂— | —C₂H₅ | | (4th) tetrazolinone, N=N, N—C₄H₉(iso) |
| I-45 | (t)C₄H₉— | cyclohexyl | H | (4th) imidazoline with CONH-phenyl |
| I-46 | C₆H₅—O—CH₂C(CH₃)₂— | —CH₃ | | (4th) triazolidinedione, N—C₆H₁₃, N-phenyl |

-continued $R_1COCHCONH$— [aryl with OR2 at 3rd position, plus 4th, 5th, 6th positions]
|
Z

| No. | R₁ | R₂ | 5th position |
|---|---|---|---|
| I-47 | (iso)C₃H₇— | —C₄H₉ | —O—(2-CH₃-phenyl)—SO₂—(3-CH₃-4-OH-phenyl) |
| I-48 | 1-adamantyl | —CH₃ | N-linked 4,5-dimethyl-2-pyridone |
| I-49 | cyclohexyl-H | —CH₃ | N-linked pyrrole-2,3-dicarboxylic acid dimethyl ester (—COOCH₃, COOCH₃) |
| I-50 | (t)C₄H₉— | —CH₃ | —O—(3-pyridyl) |

| No. | 3rd position | 4th position | 5th position | 6th position |
|---|---|---|---|---|
| I-1 | —H | —H | NHCO(CH₂)₃O—(3,5-di-t-C₅H₁₁-phenyl)— | —H |
| I-2 | —H | —H | —CONHCH(CH₃)COO(CH₂)₂O—(4-OC₁₂H₂₅-phenyl) | —H |
| I-3 | —H | —H | —NHCOCH(CH₃)CH₂SO₂C₁₂H₂₅ | —H |
| I-4 | —H | —H | —NHCO(CH₂)₂COO—(2,4-di-t-C₅H₁₁-phenyl) | —H |
| I-5 | —H | —H | —N(CH₂C₆H₅)—COCH(CH₃)CH₂SO₂C₁₈H₃₇ | —H |
| I-6 | —H | —H | —NHCO(CH₂)₂CON(C₂H₅)C₁₂H₂₅ | —H |

-continued
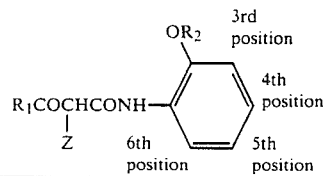
| | | | | |
|---|---|---|---|---|
| I-7 | —H | —H | 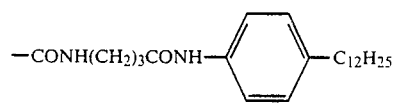 | —H |
| I-8 | —H | —H | 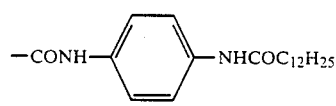 | —H |
| I-9 | —H | —H | 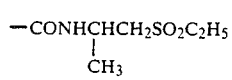 | —H |
| I-10 | —H | —H | 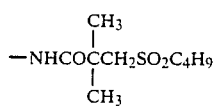 | —H |
| I-11 | —H | —H | 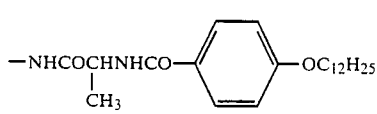 | —H |
| I-12 | —H | —H | 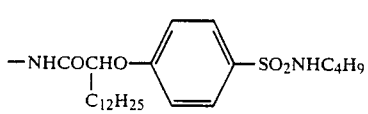 | —H |
| I-13 | —H | —H | —CONH(CH$_2$)$_2$NHSO$_2$C$_{12}$H$_{25}$ | —H |
| I-14 | —H | —H | 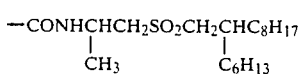 | —H |
| I-15 | —H | —H | 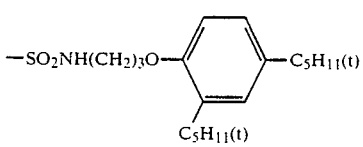 | —H |
| I-16 | —H | —H | 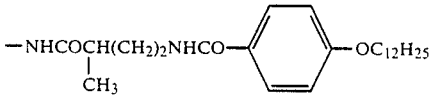 | —H |
| I-17 | —H | —H | —NHCO(CH$_2$)$_{10}$COOC$_2$H$_5$ | —H |
| I-18 | —H | —H | 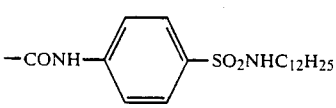 | —H |
| I-19 | —H | —H | 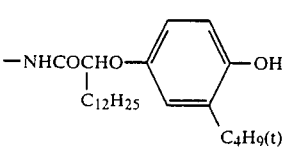 | —H |

-continued

| | | | |
|---|---|---|---|
| | | R₁COCHCONH— (benzene ring with OR₂ at 3rd position, 4th position, 5th position, 6th position) Z | |
| I-20 | —H —H | —NHCO(CH₂)₂SO₂NHCH₂CHC₄H₉<br>　　　　　　　　　　　|<br>　　　　　　　　　　C₂H₅ | —H |
| I-21 | —H —Cl | (structure with —NHCOC(CH₃)₂CH₂SO₂— attached to benzene ring bearing OC₄H₉ and C₈H₁₇(t)) | —H |
| I-22 | —H —H | —NHSO₂C₁₆H₃₃ | —H |
| I-23 | —H —H | —NHCOCH(CH₃)(CH₂)NHSO₂—⟨benzene⟩—OC₅H₁₀ | —H |
| I-24 | —H —H | —NHSO₂(CH₂)₃O—⟨benzene with C₅H₁₁(t) and C₅H₁₁(t)⟩ | —H |
| I-25 | —H —H | —NHCO(CH₂)₂NHSO₂N(CH₃)(C₆H₅) | —H |
| I-26 | —H —H | —CONH(CH₂)₄NHCO—⟨benzene with OC₁₂H₂₅ and CH₃⟩ | —H |
| I-27 | —H —H | —CONHCHCH₂SO₂NHC₁₂H₂₅<br>　　　　　|<br>　　　　C₆H₁₃ | —H |
| I-28 | —H —H | —COOC₁₂H₂₅ | —H |
| I-29 | —H —H | —NHCO(CH₂)₃NHCONHCH₂CHC₄H₉<br>　　　　　　　　　　　　　　|<br>　　　　　　　　　　　　　C₂H₅ | —H |
| I-30 | —H —H | —CONHCHCH₂CONH—⟨benzene⟩—OC₄H₉<br>　　　　|<br>　　　C₆H₁₃ | —H |
| I-31 | —H —H | —COOC₁₈H₃₅ | —H |
| I-32 | —H —H | —NHCO(CH₂)₃NHCOCH₂CHC₆H₁₃<br>　　　　　　　　　　　　|<br>　　　　　　　　　　　C₈H₁₇ | —H |
| I-33 | —H —Cl | —NHCOC(CH₃)₂CH₂NHCON(C₁₂H₂₅)(C₂H₅) | —H |

-continued
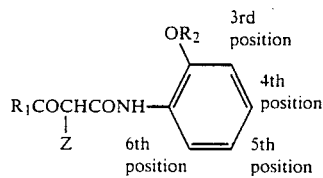
| | | | 5th position |
|---|---|---|---|
| I-34 | —H | —H | —H |
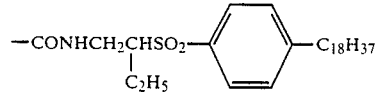
| I-35 | —H | —NHCOCHSO$_2$NHC$_{12}$H$_{25}$<br>  \|<br>  C$_{16}$H$_{33}$ | —Cl | —H |
| I-36 | —H | —Cl | | —H |
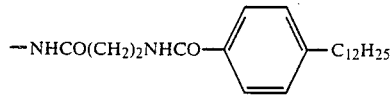
| I-37 | —H | —H | | —H |
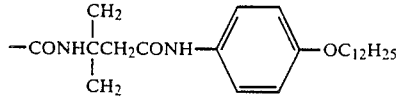
| I-38 | —H | —OCH$_3$ | | —H |
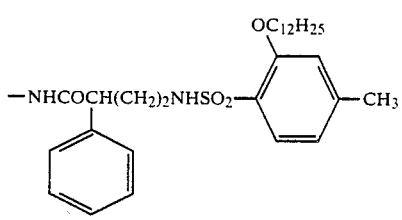
| I-39 | —H | —H | | —H |
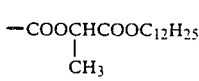
—COOCHCOOC$_{12}$H$_{25}$
       \|
       CH$_3$
| I-40 | —H | —H | | —H |
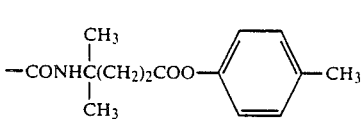
| I-41 | —H | —CONH(CH$_2$)$_4$NHSO$_2$CHC$_4$H$_9$<br>                              \|<br>                              CH$_3$ | —OCH$_3$ | —H |
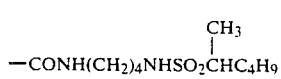
| I-42 | —H | —H | | —H |
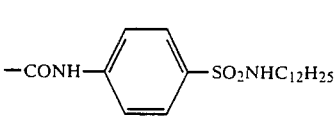
| I-43 | —H | —H | | —H |
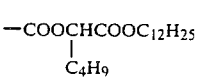
—COOCHCOOC$_{12}$H$_{25}$
       \|
       C$_4$H$_9$
| I-44 | —H | —H | | —H |
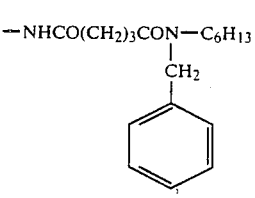

-continued

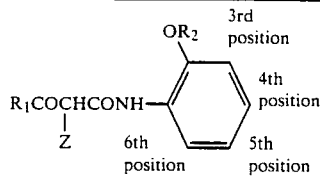

| | | | 3rd position / 4th position / 5th position / 6th position | |
|---|---|---|---|---|
| I-45 | —H | —H | 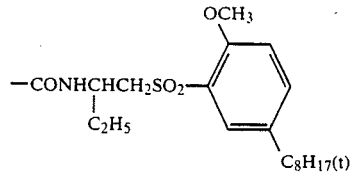 | —H |
| I-46 | —H | —H | —CONHCHCOOC$_{12}$H$_{25}$<br>　　　｜<br>　　　C$_2$H$_5$ | —H |
| I-47 | —H | —H | 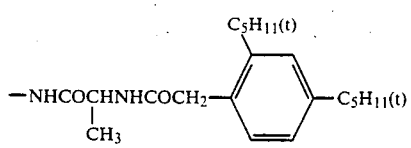 | —H |
| I-48 | —H | —H | —NHCO(CH$_2$)$_{10}$COOC$_2$H$_5$ | —H |
| I-49 | —H | —H | 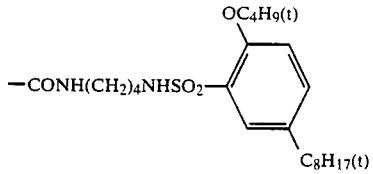 | —H |
| I-50 | —H | —H | 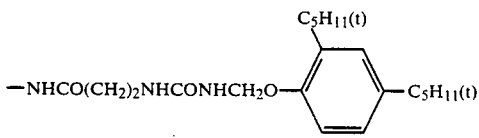 | —H |

In the case of using a yellow coupler as the yellow image forming substance of a silver halide color photographic light-sensitive material of the invention, any couplers may be suitably selected to be applied to any other color image forming layers than the yellow image forming layer. In this case, a magenta coupler and a cyan coupler are usually used.

Such magenta couplers preferably applicable to the invention include, for example, pyrazolone type compounds.

Such magenta couplers may be not only of the 4-equivalent type but also of the 2-equivalent type, similar to the case of the yellow couplers. Such magenta couplers include, concretely, those described in, for example, U.S. Pat. Nos. 2,600,788, 2,983,608, 2,062,653, 3,127,269, 3,311,476, 3,419,391, 3,519,429, 3,558,319, 3,582,322, 3,615,506, 3,834,908, and 3,891,445; West German Patent 1,810,464; West German OLS Patent Nos. 2,408,665, 2,417,945, 2,418,959, and 2,424,467; Japanese Patent Examined Publication No. 40-6031/1965; Japanese Patent O.P.I. Publication Nos. 51-20826/1976, 52-58922/1977, 49-129538/1974, 49-74027/1974, 50-159336/1975, 52-42121/1977, 49-74028/1974, 50-60233/1975, 51-26541/1976, 53-55122/1978, and 57-35858/1982; and so forth.

In the invention, the phenol type and naphthol type cyan dye forming couplers are used for the cyan couplers which are to be contained in a cyan image forming layer.

Among these cyan couplers, those represented by the following Formula C-I or C-II are preferably used.

Formula C-I wherein
R$_1$ represents an aryl group, a cycloalkyl group or a heterocyclic group; R$_2$ represents an alkyl group or a phenyl group; R$_3$ represents a hydrogen atom, a halogen atom, an alkyl group, or an alkoxy group; and
Z$_1$ represents a hydrogen atom, or a group capable of being split off upon reaction with the oxidized product of an aromatic primary amine type color developing agent.

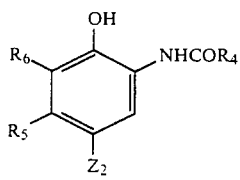

Formula C-II wherein $R_4$ represents an alkyl group such as a methyl group, an ethyl group, a propyl group, a butyl group, a nonyl group, and so forth; $R_5$ represents an alkyl group such as a methyl group, an ethyl group, and so forth; $R_6$ represents a hydrogen atom, a halogen atom such as a fluorine atom, a chlorine atom, a bromine atom, and so forth, or an alkyl group such as a methyl group, an ethyl group, and so forth; and $Z_2$ represents a hydrogen atom, or a group capable of being split off upon reaction with the oxidized product of an aromatic primary amine type color developing agent.

The above-given cyan couplers are described in, for example, U.S. Pat. Nos. 2,306,410, 2,356,475, 2,362,596, 2,367,531, 2,369,929, 2,423,730, 2,474,293, 2,476,008, 2,498,466, 2,545,687, 2,728,660, 2,772,162, 2,895,826, 2,976,146, 3,002,836, 3,419,390, 3,446,622, 3,476,563, 3,737,316, 3,758,308, and 3,839,044; British Patent Nos. 478,991, 945,542, 1,084,480, 1,377,233, 1,388,024, and 1,543,040; Japanese Patent O.P.I. Publication Nos. 47-37425/1972, 50-10135/1975, 50-25228/1975, 50-112038/1975, 50-117422/1975, 50-130441/1975, 51-6551/1976, 51-37647/1976, 51-52828/1976, 51-108841/1976, 53-109630/1978, 54-48237/1979, 54-66129/1979, 54-131931/1979, 55-32071/1980, 59-146050/1984, 59-31953/1984, and 60-117249/1985; and so forth.

The couplers applicable to the invention may be used in each silver halide emulsion layer in an amount within the range of, usually, from $1 \times 10^{-3}$ to 1 mole per mole of silver halide and, more preferably, from $1 \times 10^{-2}$ to $8 \times 10^{-1}$.

Usually, the couplers are dissolved in a high-boiling organic solvent having a boiling point of not lower than 150° C, or if required, jointly with a low boiling and/or water-soluble organic solvent, and the resulting solution is dispersively emulsified, with a surfactant, into a hydrophilic binder such as an aqueous gelatin solution, and the resulting emulsion is added in the objective hydrophilic colloidal layer. After or at the same time when the coupler solution is dispersed, it is allowed to insert a step of removing the low boiling organic solvent.

In a silver halide color photographic light-sensitive materials of the invention, any high boiling organic solvents may be used with a yellow coupler in combination. It is, however, preferable to use the organic solvents represented by the following Formula II or III.

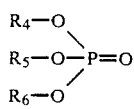

wherein $R_4$, $R_5$ and $R_6$ represent each an alkyl or aryl group, and at least two out of $R_4$, $R_5$ and $R_6$ represent each an alkyl group having not more than 16 carbon atoms.

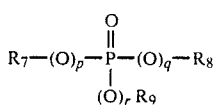

wherein $R_7$, $R_8$ and $R_9$ represent each an aliphatic group or an aromatic group: and p, q and r are each an integer of 0 or 1, provided, however, p, q and r are not 1 at the same time.

The organic solvents represented by the above-given Formula II will typically be exemplified below.

II-1 dibutyl-(2-ethylhexyl) phosphate,
II-2 tri-(2-ethylhexyl) phosphate,
II-3 tri-hexyl phosphate,
II-4 tri-butyl phosphate,
II-5 tri-octyl phosphate,
II-6 di-(2-ethylhexyl)butyl phosphate,
II-7 tri-dodecyl phosphate,
II-8 tri-decyl phosphate,
II-9 tri-(2-methylhexyl) phosphate,
II-10 diethyl-hexadecyl phosphate,
II-11 tri-amyl phosphate,
II-12 di-hexyl-orthocresyl phosphate,
II-13 di-hexyl-orthocresyl phosphate,
II-14 diethyl-(2,4-di-t-butylphenyl) phosphate,
II-15 tri-ethoxybutyl phosphate,
II-16 tri-buthoxyethyl phosphate,
II-17 di-hexyl-phenyl phosphate,
II-18 di-hexyl-(4-t-butylphenyl) phosphate, and
II-19 di-hexyl-(4-nonylphenyl) phosphate Next, the typical examples of the organic solvents represented by the above-given Formula III will be given below.

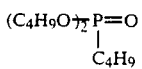  III-1

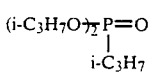  III-2

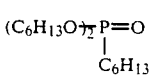  III-3

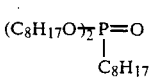  III-4

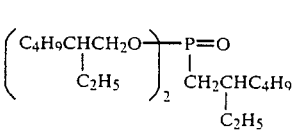  III-5

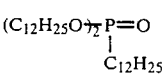  III-6

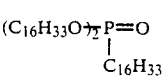  III-7

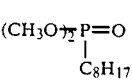  III-8

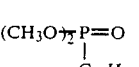  III-9

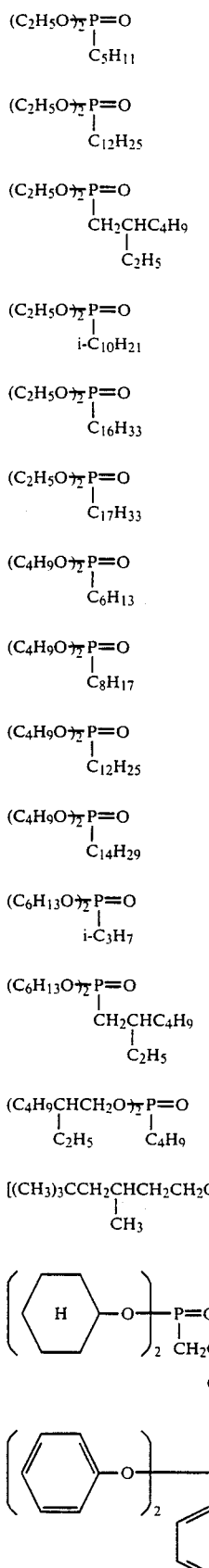
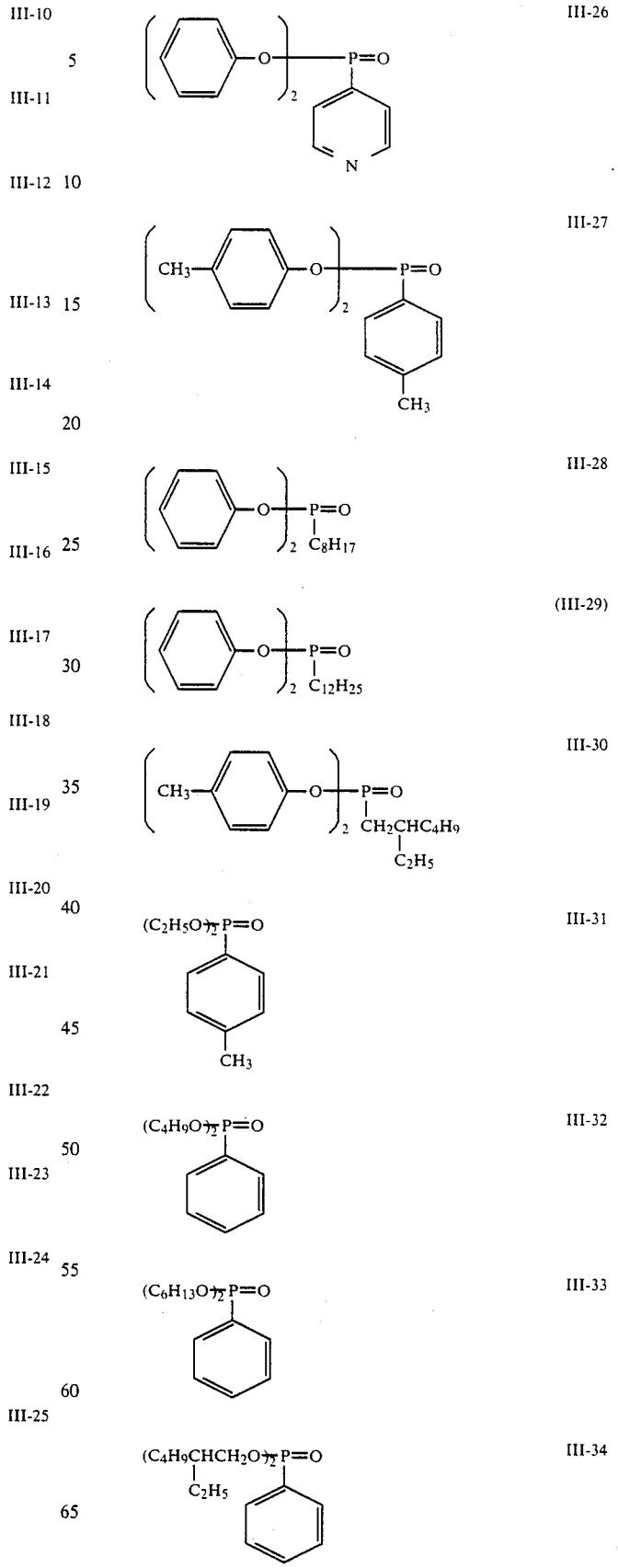

-continued
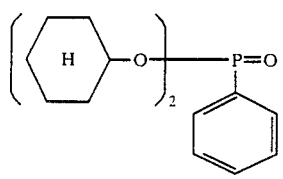 III-35
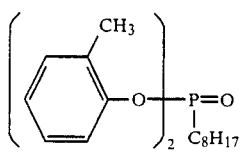 III-36
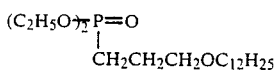 III-37
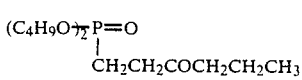 III-38
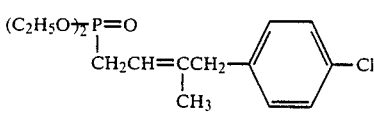 III-39
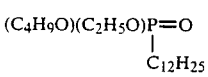 III-40
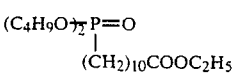 III-41
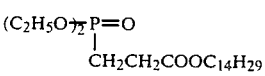 III-42
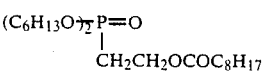 III-43
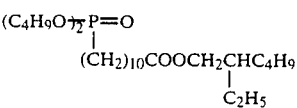 III-44
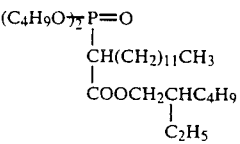 III-45
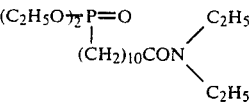 III-46
 III-47
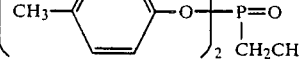 III-48
-continued
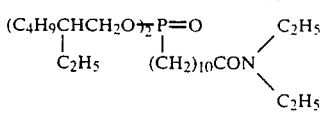 III-49
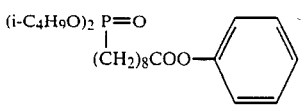 III-50
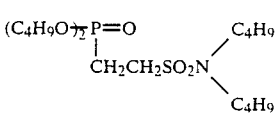 III-51
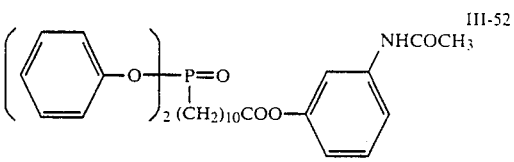 III-52
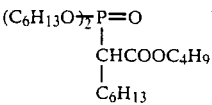 III-53
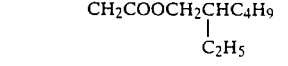 III-54
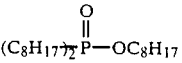 III-55
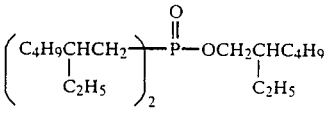 III-56
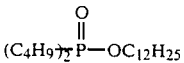 III-57
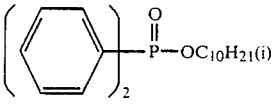 III-58
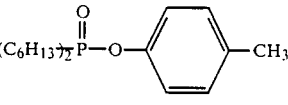 III-59
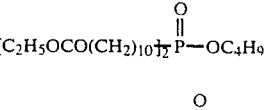 III-60
[C$_2$H$_5$OCO(CH$_2$)$_{10}$]$_2$P—OC$_4$H$_9$  III-61
[(C$_4$H$_9$)$_2$NCO(CH$_2$)$_8$]$_2$P—OC$_{12}$H$_{25}$  III-62

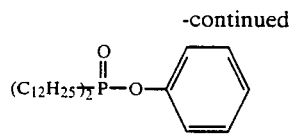 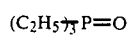 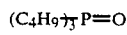 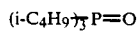 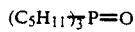 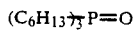 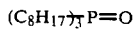 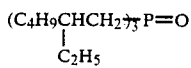 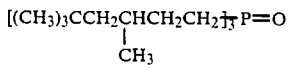 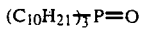 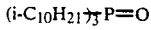 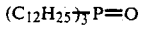 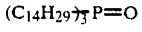 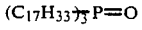 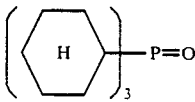 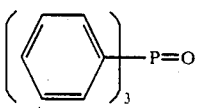 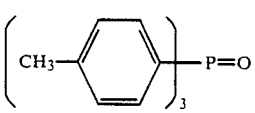 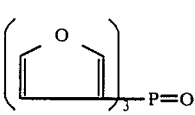 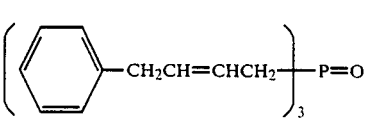 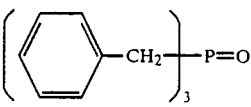
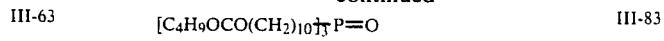 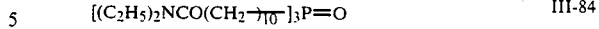  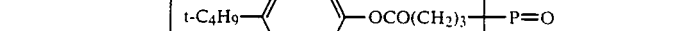  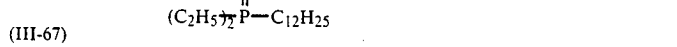  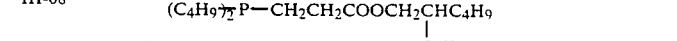     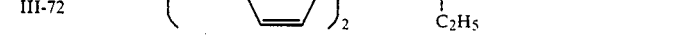   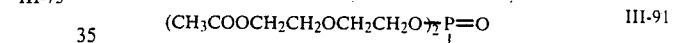      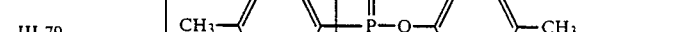 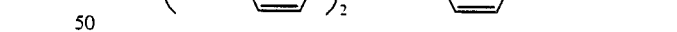     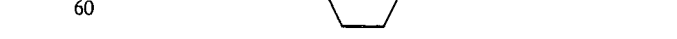 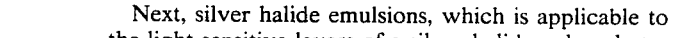 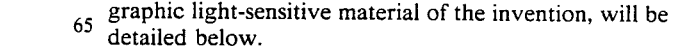 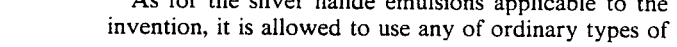   
Next, silver halide emulsions, which is applicable to the light-sensitive layers of a silver halide color photographic light-sensitive material of the invention, will be detailed below.
As for the silver halide emulsions applicable to the invention, it is allowed to use any of ordinary types of silver halide emulsions comprising such a silver halide as silver bromide, silver iodobromide, silver iodochloride, silver chlorobromide, silver chloride or the like.

The silver halide grain composition may be either uniform from the inside to the outside thereof or different between the inside and the outside. In the latter case, it is also allowed that the compositions therebetween may be varied either continuously or discontinuously.

There is no special limitation to the grain-sizes of silver halide grains. However, taking a rapid processability, sensitivity, and other photographic characteristics into consideration, the grain-size thereof should be within the range of, preferably, from 0.2 to 1.6 $\mu$m and, more preferably, from 0.25 to 0.9 $\mu$m.

In silver halide grains, the grain-sizes may be distributed either polydispersively or monodispersively. Monodispersed distribution is preferred.

Silver halide emulsions applicable to the invention may be prepared in any of an acid method, a neutral method and an ammoniacal method. Such grains may be grown either at a time or after seed grains are prepared in advance. A method of preparing seed grains and a method of growing them may be either the same with or the different from each other.

As for the methods of reacting a soluble silver salt with a soluble halide, it is allowed to use any of a normal mixing method, a reverse mixing method, a double-jet mixing method and the combinations thereof. Further, as to one of the double-jet mixing methods, it is also allowed to use a pAg-controlled double-jet method disclosed in, for example, Japanese Patent O.P.I. Publication No. 54-48521/1979 and so forth.

Further, if required, it is allowed to use therein a silver halide solvent such as thioether or the like.

Any configurations of silver halide grains may be used.

As for silver halide grains relating to the invention, it is allowed to use either those having an uniform configuration or a mixture of grains having various configurations.

In the course of forming and/or growing silver halide grains, metal ion can be added to the inside and/or the surface of the grains of a silver halide emulsion applicable to the invention by making use of a cadmium salt, zinc salt, lead salt, thallium salt, iridium salt or the complex salt thereof, rhodium salt or the complex salt thereof, or iron salt or the complex salt thereof, and reduction-sensitization nuclei can also be provided to the inside and/or surface of the grains by placing them in an appropriate reducing atmosphere.

After completing the growth of silver halide grains, unnecessary soluble salts are allowed to either be removed from or remain as they are in a silver halide emulsion applicable to the invention. If the salts are removed therefrom, they may be removed in the method disclosed in, for example, Research Disclosure No. 17643.

Silver halide grains applicable to the invention are allowed to form a latent image mainly either on the surfaces thereof or inside the grains.

Silver halide grains applicable to the invention may be chemically sensitized in any of ordinary methods including, for example, a sulfur-sensitizing method, using either a sulfur-containing compound capable of reacting with silver ions or active gelatin; a selenium-sensitizing method, using a selenium compound; a reduction-sensitizing method, using a reducing substance; a noble-metal sensitizing method, using gold or other noble metal compound; and so forth. These sensitizing methods may be used either independently or in combination.

In the case that a direct-positive image-forming silver halide emulsion is used as a silver halide emulsion, an internal latent image-forming type emulsion, for example, may be used. These emulsions include, for example, the so-called conversion type silver halide emulsion prepared in a conversion process, described in, for example, U.S. Pat. No. 3,592,250; silver halide emulsions each containing internally chemical-sensitized silver halide grains, described in, for example, U.S. Pat. Nos. 3,206,316, 3,317,322 and 3,367,778; silver halide emulsions each comprising silver halide grains containing polyvalent metal ions, described in, for example, U.S. Pat. Nos. 3,271,157, 3,447,927, and 3,531,291; silver halide emulsions each comprising dopant-containing silver halide grains which are slightly chemical-sensitized on the surfaces thereof, described in, for example, U.S. Pat. No. 3,761,276; the so-called core-shell type silver halide emulsions prepared in a laminating process, described in, for example, Japanese Patent O.P.I. Publication Nos. 50-8524/1975, 50-38525/1975 and 53-2408/1978; silver halide emulsions described in, for example, Japanese Patent O.P.I. Publication Nos. 52-156614/1977, 55-127549/1980 and 57-79940/1982; and so forth. In this case, particularly preferable internal latent image type silver halide emulsions include those comprising lamination-type grains.

When the internal latent image type silver halide emulsions are used, it is allowed to add therein a stabilizer which is ordinarily used to keep the surface sensitivity as low as possible, provide a much lower minimum density and make the characteristics thereof more stable. Such stabilizers include, for example, a compound having an azaindene ring, a heterocyclic compound having a mercapto group, and so forth.

In the silver halide color photographic light-sensitive materials of the invention, a sensitizing dye is used therein to provide at least three silver halide emulsion layers each having the different spectral sensitivity. The following sensitizing dyes may be used for the purpose.

The typical examples of sensitizing dyes usefully applicable to a blue light-sensitive silver halide emulsion layer include those disclosed in, for example, West German Patent No. 929,080; U.S. Pat. Nos. 2,231,658, 2,493,748, 2,503,776, 2,519,001, 2,912,329, 3,656,959, 3,672,897, 3,694,217, 4,025,349 and 4,046,572; British Patent No. 1,242,588; Japanese Patent Examined Publication Nos. 44-14030/1969 and 52-24844/1977; and so forth.

The typical examples of sensitizing dyes usefully applicable to a green light-sensitive silver halide emulsion layer include cyanine dyes, merocyanine dyes or complex cyanine dyes, of which disclosed in, for example, U.S. Pat. Nos. 1,939,201, 2,072,908, 2,739,149 and 2,945,763; British Patent No. 505,979; and so forth.

The typical examples of sensitizing dyes usefully applicable to a red light sensitive silver halide emulsion layer include cyanine dyes, merocyanine dyes or complex cyanine dyes disclosed in, for example, U.S. Pat. Nos. 2,269,234, 2,270,378, 2,442,710, 2,454,629 and 2,776,280; and so forth.

Further, the cyanine dyes or complex cyanine dyes such as those disclosed in U.S. Pat. Nos. 2,213,995, 2,493,748 and 2,519,001; West German Patent No. 929,080; and so forth may be advantageously applied to green or red light-sensitive silver halide emulsions.

The above-given sensitizing dyes may be used either independently or in combination. Such combination thereof is often used particularly to make a supersensitization. The typical examples thereof are given in, for example, Japanese Patent Examined Publication Nos. 43-4932/1968, 43-4933/1968, 43-4936/1968, 44-32753/1969, 45-25831/1970, 45-26474/1970, 46-11627/1971, 46-18107/1971, 47-8741-1972, 47-11114/1972, 47-25379/1972, 47-37443/1972, 48-28293/1973, 48-38406/1973, 48-38407/1973, 48-38408/1973, 48-41204/1973, 49-6207/1974, 50-40662/1975, 53-12375/1978, 54-34535/1979 and 55-1569/1980; Japanese Patent O.P.I. Publication Nos. 50-3220/1975, 50-33828/1975, 50-38526/1975, 51-107127/1976, 51-115820/1976, 51-135528/1976, 51-151527/1976, 52-23931/1977, 52-51932/1977, 52-104916/1977, 52-104917/1977, 52-109925/1977, 52-110618/1977, 54-80118/1979, 56-25728/1981, 57-1483/1982, 58-10753/1983, 58-91445/1983, 58-153926/1983, 59-114533/1984, 59-11645/1984 and 59-116647/1984; U.S. Pat. Nos. 2,688,545, 2,977,229, 3,397,060, 3,522,052, 3,527,641, 3,617,293, 3,628,964, 3,666,480, 3,672,898, 3,679,428, 3,703,377, 3,769,301, 3,814,609, 3,837,862 and 4,026,707.

Among the above-given sensitizing dyes, those particularly preferable for the invention include a cyanine dye. It is preferable to add a cyanine dye into at least one of yellow-, magenta or cyan-image forming layers. In a further preferable embodiment of the invention, such cyanine dye is used in at least one of the yellow image-forming layer and an image-forming layer having a λmax of the spectral sensitivity not less than 150 nm not apart from the λmax in the yellow image-forming layer.

Such sensitizing dyes may be used together with a dye having no spectral sensitization function in itself, or with a material substantially incapable of absorbing visible rays of light, that is, that capable of displaying a super-sensitization, including, for example, aromatic organic acid formaldehyde condensation products such as those described in U.S. Pat. No. 3,473,510; a cadmium salt; an azaindene compound; an aminostyrene compound substituted with a nitrogen-containing heterocyclic ring group such as those described in U.S. Pat. Nos. 2,933,390 and 3,635,721; and so forth. The combinations described in, for example, U.S. Pat. Nos. 3,615,613, 3,615,641, 3,617,295 and 3,635,721 are particularly useful.

Besides the above, the silver halide color photographic light-sensitive materials of the invention are further allowed to contain additives which are usually used.

The silver halide color photographic light-sensitive materials of the invention may also be provided, if required, with various photographic component layers such as a filter layer, an interlayer, a protective layer, a subbing layer, a backing layer, an antihalation layer and so forth, as well as emulsion layers each comprising a layer so arranged onto a support as to carry an image thereon. From the viewpoint of obtaining an excellent color reproduction of a yellow image from the highlight portions to the shadow portions, it is preferable to arrange a filter layer as one of the photographic component layers and/or to add a dye into at least one photographic component layer.

It is preferable to arrange the above-mentioned filter layer to a position closer to a support than the yellow image-forming layer. It is more preferable to add a metal colloid as a coloring material.

Japanese Patent O.P.I. Publication No. 52-23933/1977 discloses a combination of a 2-equivalent type yellow coupler and a phosphate. In this embodiment, the amount of silver coated on a yellow imageforming layer was within the range from 100 mg/m$^2$ to 150 mg/m$^2$. However, such an amount coated is not desirable for making a yellow image tone closer to the tone of a printed matter from small dots to large dots. It is preferable to coat silver in an amount within the range of 200 mg/m$^2$ to 700 mg/m$^2$ and, more preferably from 250 mg/m$^2$ to 500 mg/m$^2$.

Any types of supports may be used, however, the typical examples thereof include baryta paper; polyolefin-laminated paper such as those laminated with polyethylene; polyethyleneterephthalate film into which a white pigment is kneaded; and so forth.

A silver halide color photographic light-sensitive material of the invention is comprised of at least three layers each having a different spectral sensitivity, namely, one layer serving as a blue light-sensitive silver halide emulsion layer; another layer serving as a green light-sensitive silver halide emulsion layer which is provided with a maximum sensitivity to green light by a sensitizing dye; and the rest serving as a red light-sensitive silver halide emulsion layer which is provided with a maximum sensitivity to red light by a sensitizing dye. Or, such a light-sensitive material is comprised of the like layer arrangements. In this way, a spectral sensitivity which can hardly cause a color mixing may be preferably provided when exposing a plurality of black-and-white halftone-dot images to rays of light each having different spectral distributions. The preferable layer arrangements including the above-mentioned combination of the spectral sensitivities of the above three layers and the hue of an image will be exemplified below.

| Spectral sensitivity λmax | | |
|---|---|---|
| in a yellow coupler containing layer | in a magenta coupler containing layer | in cyan coupler containing layer |
| 470 nm | 550 nm | 650 nm |
| 470 nm | 550 nm | 700 nm |
| 450 nm | 550 nm | 700 nm |
| 470 nm | 590 nm | 700 nm |
| 550 nm | 470 nm | 660 nm |
| 660 nm | 470 nm | 550 nm |
| 470 nm | 650 nm | 800 nm |

The light-sensitive materials of the invention can be exposed to an electromagnetic wave in a spectral region to which an emulsion layer of the light-sensitive material is sensitive. The light sources applicable thereto include those known as natural light, i.e., sunlight, a tungsten lamp, a fluorescent lamp, a mercury lamp, a xenon-arc lamp, a carbon-arc lamp, xenon-flash lamp, a flying-spot cathode-ray various laser beams, a light emitting diode, rays of light emitted from a phosphor excited by electron beams, X-rays, γ-rays, α-rays or the like, and so forth.

It is allowed that a silver halide color photographic light-sensitive material of the invention may be comprised of a blue-sensitive, green-sensitive and red-sensitive layers each with which an ordinary type color paper is provided, and three-color separation filters may be used to serve as an optical filter, such as Wratten filters Nos. 25, 29, 58, 61, 47B, 98 or 99.

When forming an image on a silver halide color photographic light-sensitive material of the invention, it is preferable to carry out in the presence of a fluorescent whitening agent. Such fluorescent whitening agent may be added into the light-sensitive material or a processing solution and, more preferably, into a color developer.

In this invention, color developing agents applicable to color developers include those represented by Formula VI which may be used together with other color developing agent.

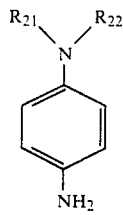

wherein $R_{21}$ and $R_{22}$ each represent an alkyl group, provided, $R_{21}$ and $R_{22}$ may the same with or the different from each other, and $R_{21}$ and $R_{22}$ may be so bound together as to complete a ring.

The developing agents applicable to the invention and represented by Formula VI include, preferably, those having either one of $R_{21}$ and $R_{22}$ representing a group making the compound water-soluble and, more preferably, those having $R_{21}$ representing a non-substitutable alkyl group and $R_{22}$ representing a hydroxyalkyl group.

The groups making the compound water-soluble applicable to the invention and represented by Formula VI include, preferably, the following concrete groups:
—(CH$_2$)$_n$—CH$_2$OH,
—(CH$_2$)$_m$—NHSO$_2$—(CH$_2$)$_n$—CH$_3$,
—(CH$_2$)$_m$—O—(CH$_2$)$_n$—CH$_3$,
—(CH$_2$CH$_2$O)$_n$C$_m$H$_{2m+1}$
wherein m and n are each an integer of not less than 0, —COOH group, —SO$_3$H group, and so forth.

Now, the typical examples of the color developing agents applicable to the invention and having Formula VI will be exemplified below.

Exemplified compounds of Formula VI

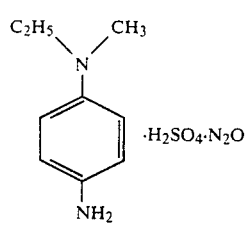

VI-1

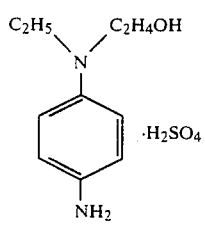

VI-2

-continued

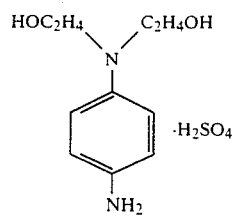

VI-3

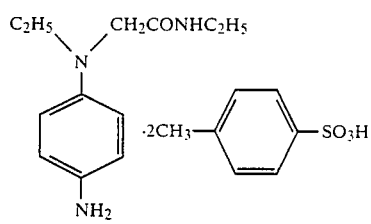

VI-4

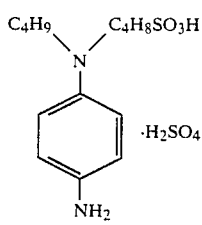

VI-5

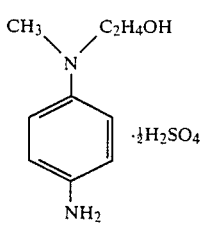

VI-6

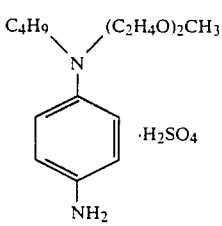

VI-7

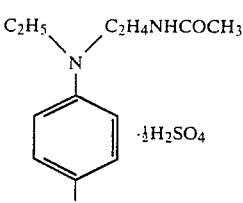

VI-8

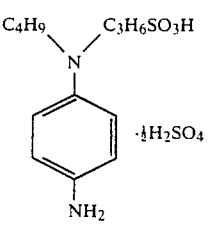

VI-9

-continued

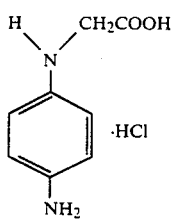

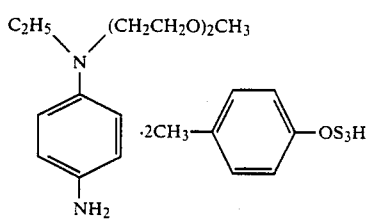

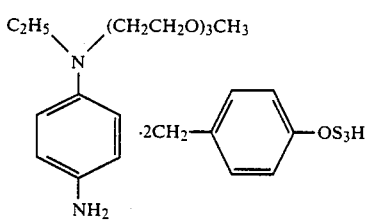

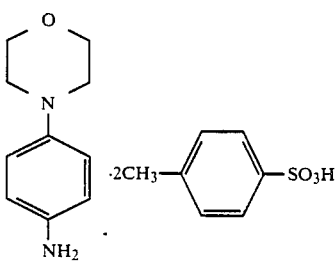

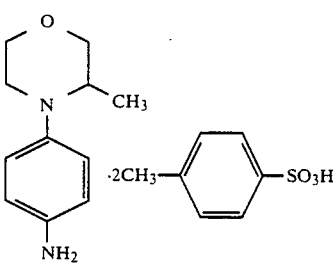

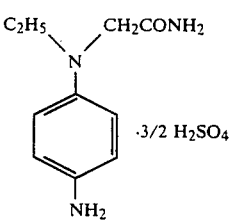

-continued

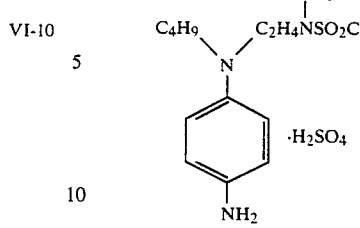

VI-10

VI-11

VI-12

VI-13

VI-14

VI-15

Among the above exemplified color developing agents, those particularly preferable compounds are represented by Formula VI-2.

The compounds applicable to the invention and represented by Formula VI can be synthesized in the method described in 'J. Am. Chem. Soc.', Vol. 73, 3100.

Out of the whole developing agent added in a developer, the contents of the compound represented by Formula VI are, preferably, not less than 55 mol %, more preferably, not less than 70 mol %, further more preferably, not less than 80 mol % and, most preferably, not less than 90 mol %.

An amount of the compounds represented by Formula VI added into a color developer is, preferably, not less than $0.5 \times 10^{-2}$ moles per mole of a color developer used, more preferably, within the range of $1.0 \times 10^{-2}$ to $1.0 \times 10^{-1}$ moles and, further more preferably, within the range of $1.5 \times 10^{-2}$ to $5.0 \times 10^{-2}$ moles.

These compounds are more stable in the form of a salt than in the free state. Therefore, they are usually used in the salt form. For example, they are used in the form of a hydrochloride or a sulfate.

Among the developing agents which may be jointly used with the developing agnets represented by Formula VI, aminophenol type developing agents include, for example, o-aminophenol, p-aminophenol, 5-amino-2-oxytoluene, 2-amino-3-oxytoluene, 2-oxy-3-amino-1,4-dimethylbenzene, and so forth.

The particularly useful aromatic primary amine type color developing agents usable with the developing agents of Formula IV include N,N-dialkyl-p-phenylenediamine type compounds of which the alkyl or phenyl group may be either substituted or non-substituted. Among them, the more particularly preferable compounds include, for example, 3-methyl-4-amino-N-ethyl-N-(β-methanesulfonamidoethyl)aniline sulfate and 4-amino N-ethyl-N-hydroxyethyl aniline sulfate.

The color developers applicable for processing silver halide photographic light-sensitive materials of the invention are allowed to be added with any compounds having been well-known for the components of developers, as well as the above-mentioned aromatic primary amine type color developing agents. Such developer-component compounds include, for example, alkalizing agents such as sodium hydroxide, sodium carbonate, potassium carbonate and so forth, alkali-metal bisulfites, alkali-metal thiocyanates, alkali-metal halides, benzyl alcohol, a water-softener, a thickener, and so forth.

The pH values of such color developers are, usually, not lower than 7 and, most generally, within the range of about 10 to about 13.

A color developing temperature is, usually, not lower than 15° C and, generally, within the range of 20° C to 50° C. A rapid processing should preferably be carried out at a temperature of not lower than 30° C. Generally, a color development is carried out for a period of time within the range of, preferably, from 20 seconds to 3 minutes and, more preferably, from 30 seconds to 2 minutes 30 seconds.

Silver halide photographic light-sensitive materials of the invention may also be treated in an alkaline activation bath in such a way that the above-mentioned color developing agent is added in the form of itself or its precursor into a hydrophilic colloidal layer.

In the case that a direct-positive image is to be formed by making use of an internal latent-image type silver halide emulsion layer which is to serve as an image-forming layer of a light-sensitive material of the invention, the principal image-forming steps in this case are, generally, as follows. An internal latent-image type silver halide photographic light-sensitive material not fogged in advance is surface-developed either after exposed imagewise to light and then fogged, or while it kept being fogged. In this case, a fogging treatment is carried out by giving an overall, uniform exposure, or by making use of a fogging agent. Such overall uniform exposure is preferably given to an imagewise exposed internal latent-image type silver halide photographic light-sensitive material after the light-sensitive material is dipped in or wet with a developer or other aqueous solution. Any light-source is applicable thereto, provided it emits rays of light within the spectral wavelength region of the internal latent-image type silver halide photographic light-sensitive material used. In this case, it is allowed to expose the light-sensitive material to light having a high illumintion intensity such as flashlight for a short time, or to dim light for a longer time. An overall uniform exposure time can be adjusted variously so as to ultimately obtain an optimum positive-image, depending upon the characteristics of an internal latent image type silver halide photographic light-sensitive material used, development conditions, and the types of a light-source used. Various types of compounds may be used for the above-mentioned fogging agents. Such a fogging agent may be made present in the course of a development. For example, they may be added into any one of a silver halide emulsion layer of an internal latent-image type silver halide photographic light sensitive material, a developer, or a processing solution used in advance of a developing step. It is preferable to add them in an internal latent image type silver halide photographic light-sensitive material and, in this case, it is particularly preferable to add them into a silver halide emulsion layer of the light sensitive material. The amount thereof to be added thereinto may be variably changed to meet the requirements. When adding them into a silver halide emulsion layer, the amount thereof added is to be within the range of 1 to 1500 mg per mol of silver halide used and, more preferably, from 10 to 1000 mg. When adding them into a processing solution such as a developer, the amount thereof added is to be within the range of from 0.01 to 5 g. per liter and, more preferably, from 0.08 to 0.15 g. per liter. The above-mentioned fogging agents include, for example, hydroazines such as those described in, for example, U.S. Pat. Nos. 2,563,785 and 2,588,982; hydrazide or hydrazone compounds such as those described in, for example, U.S. Pat. No. 3,227,552; heterocyclic quaternary nintrogen compounds such as those described in, for example, U.S. Pat. Nos. 3,615,615, 3,718,470, 3,719,494, 3,734,738, 3,759,901 and so forth; and acylhydrazinophenylthioureas such as those described in, for example, U.S. Pat. No. 4,030,925. These fogging agents may also be used in combination. In Research Disclosure No. 15162, for example, there is a description that both non-adsorptive and adsorptive fogging agents are used in combination. This type of the combination may also be applied to the invention. The following hydrazine compounds may typically be exemplified as the useful fogging agents. Namely, a hydrazine hydrochloride, a phenylhydrazine hydrochloride, a 4-methylphenylhydrazine hydrochloride, 1-formyl-2-(4-methylphenyl)-hydrazine, 1-acetyl-2-phenylhydrazine, 1-acetyl-2-(4-acetoamidophenyl)hydrazine, 1-methylsulfonyl-2-phenylhydrazine, 1-benzoyl-2-phenylhydrazine, 1-methylsulfonyl-2-(3-phenylsulfonamidophenyl)hydrazine, formaldehydephenylhydrazine, the following compounds, and so forth.

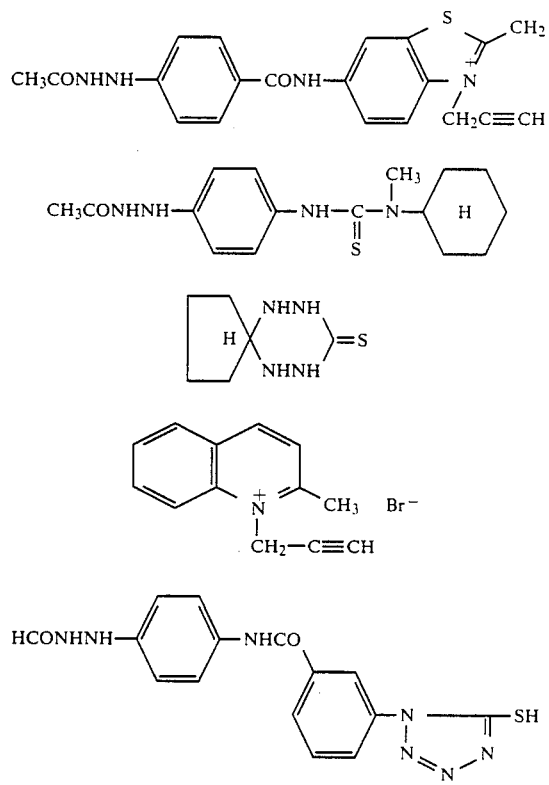

When a light-sensitive material of the invention was embodied as an internal latent-image type silver halide photographic light-sensitive material, a direct positive-image is formed in such a manner that, after an imagewise exposure, it is exposed overall to light or developed in the presence of a fogging agent. In this case, the light-sensitive material may be developed in any developing processes including, preferably, a surface-developing process in which a development is made with a developer substantially containing no silver halide solvent.

In the invention, an internal latent-image type silver halide photographic light-sensitive material can be embodied in such a manner that an exposed silver halide color photographic light-sensitive material is treated with a developer and a processing solution having a fixing function so that a visualized positive-image may be so formed as to correspond to an original image.

The above-mentioned developing processes include not only a color development but also a combination of a black-and-white development and a color development, such as those applied to a reversal color process.

And, these processes also include the developing process which is carried out by an overall exposure or in the presence of a fogging agent.

The black-and-white developers applicable to such developing processes include, for example, those so-called first black-and-white developer applicable to the processes of commonly known color photographic light-sensitive materials, and those for processing black-and-white photographic light-sensitive materials. These developers are also allowed to contain various kinds of components having been publicly known to be added into black-and-white developers.

Typical examples of such components include developing agents such as 1-phenyl-3-pyrazolidone, Metol, and hydroquinone; preservatives such as a sulfite; development accelerators comprising alkali such as sodium hydroxide, sodium carbonate, potassium carbonate and so forth; inorganic or organic development inhibitors such as potassium bromide, 2-methylbenzimidazole, methylbenzthiazole and so forth; hard-water softeners such as a polyphosphate; inhibitors for excessive surface development such as those comprising a small amount of an iodide or mercapto compound; and so forth.

Silver halide photographic light sensitive materials of the invention are color developed, bleached and then fixed. The bleaching and fixing treatments may be carried out at the same time.

EXAMPLES

Now, some typical embodiments of the invention will be detailed below. It is, however, to be understood that the embodiments of the invention shall not be limited thereto.

EXAMPLE 1

Over a paper support laminated with polyethylene on the both sides thereof, each of the following layers was coated in order from the support side, so that the negative type silver halide color photographic light-sensitive material Samples No. 1 through No. 7 were prepared.

Layer 1 . . . A layer containing 1.2 g/m² of gelatin; 0.32 g/m²—in the terms of silver contents and, hereinafter, so forth on—of a blue-sensitive AgClBr emulsion having an average grain-size of 0.8 μm; and 0.80 g/m² of yellow coupler dissolved in the oily matter shown in Table 1

Layer 2 . . . An interlayer comprising 0.70 g/m² of gelatin; 8 mg/m² of irradiation dye AI-1; and 4 mg/m² of AI-2

Layer 3 ... A layer containing 1.25 g/m² of gelatin; 0.20 g/m² of a green-sensitive AgClBr emulsion having an AgBr content of 70 mol %; and 0.62 g/m² of magenta coupler MC-1 dissolved in 0.30 g/m² of dioctyl phthalate Layer 4 . . . An interlayer comprising 1.20 g/m² of gelatin Layer 5 . . . A layer containing 1.20 g/m² of gelatin; 0.30 g/m² of a red-sensitive AgClBr emulsion having an AgBr content of 70 mol %; and 0.45 g/m² of cyan coupler CC-1 dissolved in 0.20 g/m² of dioctyl phthalate Layer 6 . . . A layer containing 1.00 g/m² of gelatin; and 0.30 g/m² of UV-absorbent UV-1 dissolved in 0.20 g/m² of dioctyl phthalate, and Layer 7 . . . A layer containing 0.50 g/m² of gelatin MC-1

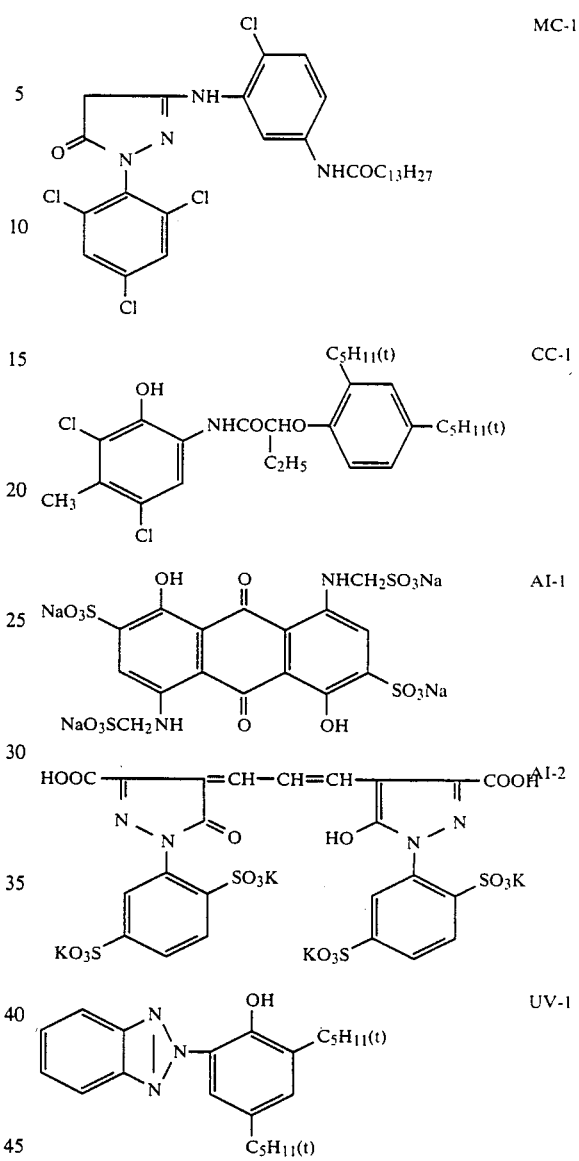

Further, as a hardening agent, sodium 2,4-dichloro-6-hydroxy-s-triazine was added in a proportion of 0.017 g to one gram of gelatin into each of layers 2, 4 and 7.

Samples for visual observation were prepared in such a manner that Samples No. 1 through No. 7 were exposed to white light through both of a blue filter Wratten No. 98 and an ND filter, upon adjusting the density of the ND filter to be 1.5 in a yellow color density, i.e., a reflection density obtained from a blue light measured by a densitometer Model PDA-60, and Samples No. 1 through No. 7 thus exposed were then developed.

The above-mentioned light-sensitive materials No. 1 through No. 7 were processed in the following processing steps.

| Processing steps - carried out at 35° C - | |
|---|---|
| Color developing | 1 min., and 1.5 min. |
| Bleach-fixing | 1 min. |
| Washing | 1 min. |
| Drying | 2 min. at 60 to 80° C |

The composition of each processing solution was as follows:

| (Color developer A) | |
|---|---|
| Pure water | 800 ml |
| Hydroxylamine sulfate | 2.0 g |
| Potassium bromide | 1.5 g |
| Sodium chloride | 1.0 g |
| potassium sulfite | 2.0 g |
| Triethanolamine | 2.0 g |
| 4-amino-N-ethyl-N-hydroxyethyl-aniline sulfate | 4.5 g |
| 1-hydroxyethylidene-1,1-diphosphate, in a 60% aqueous solution | 1.5 ml |
| Potassium carbonate | 32 g |
| Whitex BB, in a 50% aqueous solution, a fluorescent whitening agent, manufactured by Sumitomo Chemical Co. | 2 ml |
| Add pure water to make | 1 liter |
| Adjust pH with a 20% potassium hydroxide solution or a 10% dilute sulfuric acid solution to | pH = 11.2 |
| (Bleach-fixer) | |
| Pure water | 550 ml |
| Iron (III) ammonium ethylenediamine tetraacetate | 65 g |
| Ammonium thiosulfate | 85 g |
| Sodium hydrogensulfite | 10 g |
| Sodium metabisulfite | 2 g |
| Disodium ethylenediaminetetraacetate | 20 g |
| Sodium bromide | 10 g |
| Add pure water to make | 1 liter |
| Adjust pH with aqueous ammonia or dilute sulfuric acid to | pH = 7.0 |

After completed the above-mentioned processing steps, the suitability for color-proofing was judged by comparing the approximate degrees thereof with each hue of printed images.

The results thereof are shown in Table 1 below.

TABLE 1

| Sample No. | Yellow coupler Kind | Amt. added (g/m²) | Oily matter Kind | Amt. added (g/m²) | Suitability for color proofing |
|---|---|---|---|---|---|
| 1 (Comp.) | YC-1 | 0.8 | HBS-1 | 0.4 | Poor |
| 2 (Comp.) | YC-2 | 0.8 | HBS-2 | 0.4 | Poor |
| 3 (Inv.) | I-3 | 0.8 | II-3 | 1.6 | Good |
| 4 (Inv.) | I-3 | 0.8 | II-1 | 1.6 | Good |
| 5 (Inv.) | I-3 | 0.8 | HBS-3 | 1.6 | Acceptable |
| 6 (Inv.) | I-3 | 0.8 | III-69 | 0.8 | Good |

TABLE 1 -continued

| Sample No. | Yellow coupler Kind | Amt. added (g/m²) | Oily matter Kind | Amt. added (g/m²) | Suitability for color proofing |
|---|---|---|---|---|---|
| 7 (Inv.) | I-1 | 0.8 | III-4 | 1.6 | Good |

HBS-1

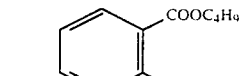

HBS-2

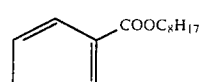

YC-1

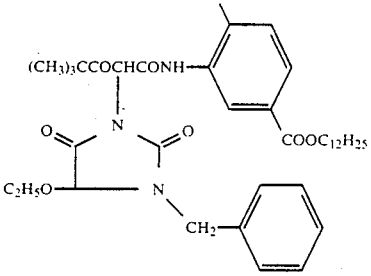

YC-2

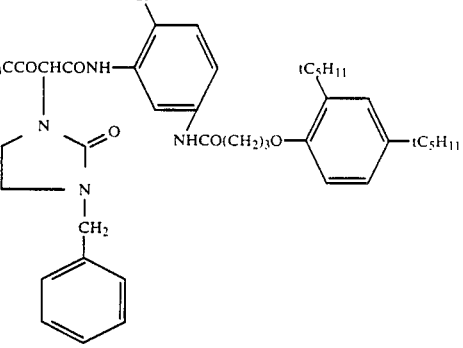

HBS-3  Diethyllaurylamide

It is found from Table 1 that the degrees of approximation between the hue of a color proof resulted and the hue of the printed image can be improved by processing a silver halide color photographic light-sensitive material for making a color-proof, which contains a yellow coupler represented by Formula I, with a color developer containing a developing agent represented by Formula VI.

EXAMPLE 2

Preparation of Emulsion S

Solutions A1 and B were added at the same time, spending three minutes, into 750 ml of a 2.0% inert gelatin solution, while keeping them at 50° C and stirring. After ripened for 25 minutes and the remaining excessive salts were removed therefrom in a precipitation-washing method, they were redispersed and then solutions C1 and D1 were added. After ten minutes, the remaining excessive water-soluble salts were removed therefrom again and then a small amount of gelatin was added. Therein silver halide grains were dispersed.

Preparation of Emulsion L

The following solutions A2 and B were added at the same time, spending 15 minutes, into 750 ml of a 1.5% inert gelatin solution, while keeping them at 60° C and stirring. After ripened for 40 minutes and then excessive salts were removed therefrom in a precipitation-washing method, they were redispersed and 10 mg of hypo was added. Then, solutions C2 and D2 were added. After ten minutes, the remaining excessive water-soluble salts were removed again and then a small amount of gelatin was added. Therein silver halide grains were dispersed.

Preparation of Emulsion M

The following solutions A3 and B were added at the same time, spending 5 minutes, into 750 ml of a 2.0% inert gelatin solution, while keeping them at 50° C and stirring. After ripened for 25 minutes and then the remaining excessive salts were removed therefrom in a precipitation-washing method, they were redispersed and then added with solutions C1 and D2. After 10 minutes, excessive water-soluble salts were removed again and then a small amount of gelatin was added. Therein silver halide grains were dispersed.

| Solution A1: | Pure water | 2000 ml |
|---|---|---|
| | NaCl | 35 g |
| | $NH_4Br$ | 109.6 g |
| | KI | 0.8 g |
| Solution A2: | Pure water | 1000 ml |
| | NaCl | 26.3 g |
| | $NH_4Br$ | 109.6 g |
| | KI | 0.8 g |
| Solution A3: | Pure water | 1000 ml |
| | NaCl | 58.8 g |
| | KBr | 12 g |
| Solution B: | Pure water | 1200 ml |
| | $AgNO_3$ | 170 g |
| Solution C1: | Pure water | 1000 ml |
| | NaCl | 60 g |
| | $NH_4Br$ | 6.9 g |
| Solution C2: | Pure water | 1000 ml |
| | NaCl | 31.6 g |
| Solution D1: | Pure water | 1000 ml |
| | $AgNO_3$ | 70 g |
| Solution D2: | Pure water | 1000 ml |
| | $AgNO_3$ | 80 g |

A multilayered color light-sensitive material was prepared by adding the sensitizing dyes, couplers and so forth into the resulted three types of emulsions, as mentioned below.

Layer 1—A red-sensitive emulsion layer

A mixture of 0.2 moles of emulsion S and 0.8 moles of emulsion M was added with sensitizing dyes D-3 and D-4, stablizers T-1 and T-2, surfactant S-2, and a protect-dispersed coupler solution containing dibutyl phthalate, ethyl acetate, surfactant S-2, 2,5-dioctylhydroquinone, and cyan couplers CC-2 and CC-3.

Layer 2—The first interlayer

A gelatin solution was so prepared as to contain therein a protect-dispersed solution containing dioctyl phthalate, 2,5-dioctylhydroquinone, UV absorbent Tinuvin 328 manufactured by Ciba-Geigy AG, and surfactant S-1, and the resulted solution was coated so that Tinuvin could be coated in an amount of 0.15 $g/m^2$.

Layer 3—A green-sensitive emulsion layer

A mixture of 0.2 moles of emulsion S and 0.8 moles of emulsion M was added with sensitizing dye D-2, stablizers T-1 and T-2, surfactant S-2, and a protect-dispersed solution containing dibutyl phthalate, ethyl acetate, 2,5-dioctylhydroquinone, surfactant S-1, and magenta coupler MC-1. Thereto, gelatin and, further, hardening agent H-1 were added. The resulted emulsion was coated.

Layer 4—The second interlayer

This layer was prepared and coated in the same manner as in the first interlayer, except that Tinuvin 328 was coated in an amount of 0.2 $g/m^2$.

Layer 5—A yellow filter layer

In the presence of an alkaline weakly reducing agent, yellow colloidal silver was prepared in an oxidation treatment and, after a neutralization, the alkaline weakly reducing agent was removed in a noodle-washing method. The yellow colloidal silver, dioctyl phthalate, ethyl acetate, surfactant S-1 a 2,5-dioctylhydroquinone solution, surfactant S-2, and hardener H-1 were added together. The resulted colloidal silver was coated in an amount of 0.15 $g/m^2$.

Layer 6—The third interlayer

The same as the first interlayer

Layer 7—A blue-sensitive emulsion layer

A mixture of 0.7 moles of emulsion L and 0.3 moles of emulsion M was added with sensitizing dye D-1, stablizers T-1 and T-3, surfactant S-2, ethyl acetate, 2,5-dioctylhydroquinone, surfactant S-1, and the yellow coupler shown in Table 2, which was dispersively dissolved in the oily matter shown in Table 2. Thereto, gelatin and, further, hardening agent H-1 were added. The resulted emulsion was coated.

Layer 8—The fourth interlayer

This layer was prepared and coated in the same manner as in the first interlayer, except that Tinuvin 328 was so coated as to be in an amount of 0.35 $g/m^2$.

Layer 9—A protective layer

Using a gelatin solution containing colloidal silica, coating aid S-2 and hardening agents H-2 and H-3, gelatin was so coated as to be in an amount of 1.0 $g/m^2$.

Layers 1 through 9 were coated over a surface-treated polyethylene-laminated paper in a simultaneous layer-coating method and, then, dried up.

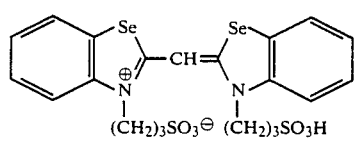

D-1

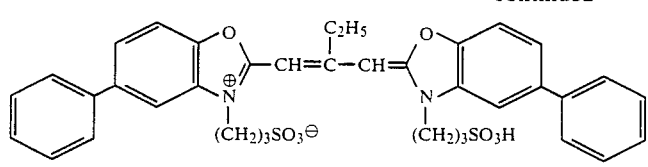
D-2
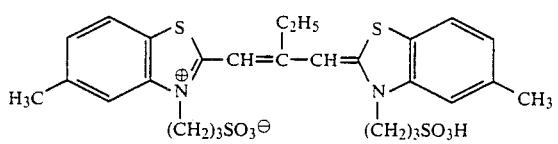
D-3
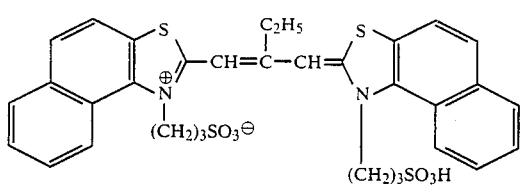
D-4
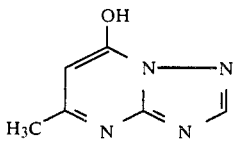
T-1
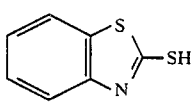
T-2
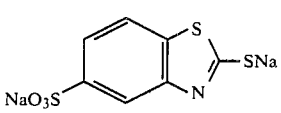
T-3
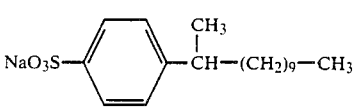
S-1
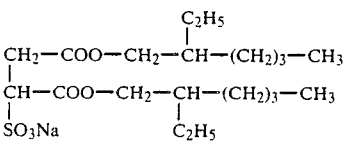
S-2
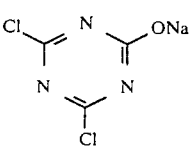
H-1
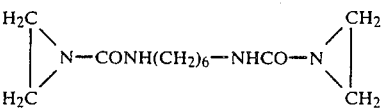
H-2
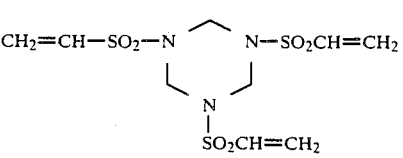
H-3

-continued

CC-2

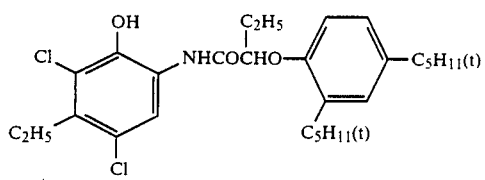

CC-3

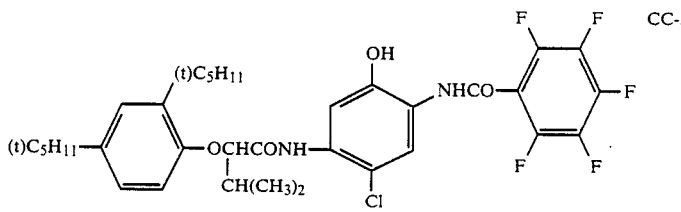

Samples No. 8 through No. 15 were exposed to white light through both of a green filter Wratten No. 99 and an ND filter upon adjusting the ND filter density, and were then exposed to white light through both of a red filter Wratten No. 26 and an ND filter upon adjusting the ND filter density. Such exposures were so made to a blue light density which was measured with a densitometer -Model PDA-60 manufactured by Konca Corporation- was so adjusted to be 1.5 through the ND filters.

These exposed samples were processed in the following processing steps.

| | Processing step | Temperature | Time |
|---|---|---|---|
| 1 | Dipping in color developer | 38° C | 8 sec. |
| 2 | Fogging exposure | — | at 1 lux, 10 sec. |
| 3 | Color developing | 38° C | 2 min. |
| 4 | Bleach-fixing | 35° C | 60 sec. |
| 5 | Stabilizing | 25 to 30° C | 1 min. 30 sec. |
| 6 | Drying | 75 to 80° C | 1 min. |

Composition of processing solutions
Color developer

| | |
|---|---|
| Benzyl alcohol | 10 ml |
| Ethylene glycol | 15 ml |
| Potassium sulfite | 2.0 g |
| Potassium bromide | 1.5 g |
| Sodium chloride | 0.2 g |
| Potassium carbonate | 30.0 g |
| Hydroxylamine sulfate | 3.0 g |
| Polyphosphoric acid (TPPS) | 2.5 g |
| Developing agent | See Table 2 |
| Fluorescent brightening agent 4,4'-diaminostilbene disulfonic acid derivative | 1.0 g |
| Potassium hydroxide | 2.0 g |
| Add water to make | 1 liter |
| Adjust pH to | pH 10.20 |

Bleach-fixer

| | |
|---|---|
| Ferric ammonium ethylenediamine-tetraacetate, dihydrate | 60 g |
| Ethylenediaminetetraacetic acid | 3 g |
| Ammonium thiosulfate in a 70% solution | 100 ml |
| Ammonium sulfite in a 40% solution | 27.5 ml |
| Adjust pH with potassium carbonate or glacial acetic acid to | pH 7.1 |
| Add water to make | 1 liter |

Stabilizer

| | |
|---|---|
| 5-chloro-2-methyl-4-isothiazoline-3-one | 1.0 g |
| Ethylene glycol | 10 g |
| 1-hydroxyethylidene-1,1-diphosphoric acid | 2.5 g |
| bismuth chloride | 0.2 g |
| Magnesium chloride | 0.1 g |
| Ammonium hydroxide in an aqueous 28% solution | 2.0 g |
| Sodium nitrilotriacetate | 1.0 g |
| Add water to make | 1 liter |
| Adjust pH with ammonium hydroxide or sulfuric acid to be | ph 7.0 |

The stabilizing step was carried out in a dual-tank type counter-current system.

With respect to the processed samples, the suitability for color-proofing was judged in the same manner as in Example 1 by making use of a sample having a blue-light density of 1.5. The results thereof are shown in Table 2.

TABLE 2

| | Dev. agent | | Yellow cplr | | Oily matter | | Suitability |
|---|---|---|---|---|---|---|---|
| Sample No. | Kind | Amt. added (g/l) | Kind | Amt. added (g/m²) | Kind | Amt. added (g/m²) | for color proofing |
| Comp. 8 | A | 5.5 | YC-1 | 0.9 | HBS-1 | 0.5 | Poor |
| Comp. 9 | A | 5.5 | YC-2 | 0.7 | HBS-4 | 0.4 | Poor |
| Inv. 10 | B | 5.0 | I-4 | 0.9 | III-69 | 0.9 | Excellent |
| Inv. 11 | B | 5.0 | I-1 | 0.9 | III-69 | 1.2 | Excellent |
| Inv.* 12 | B | 5.0 | I-1 | 0.9 | III-69 | 1.2 | Good |
| Inv.** 13 | B | 5.0 | I-1 | 0.9 | III-69 | 1.2 | Good |
| Inv.*** 14 | B | 5.0 | I-1 | 0.9 | III-69 | 1.2 | Good-Acceptable |
| Inv. | B | 5.0 | I-26 | 0.9 | III-67 | 0.7 | Excellent |

TABLE 2-continued

| | Dev. agent | | Yellow cplr | | Oily matter | | Suitability |
|---|---|---|---|---|---|---|---|
| Sample No. | Kind | Amt. added (g/l) | Kind | Amt. added (g/m$^2$) | Kind | Amt. added (g/m$^2$) | for color proofing |
| 15 | | | | | | | |

*Sample No. 12 was prepared in the same manner as in Sample No. 11, except that the fluorescent whitening agent, i.e., a 4,4'-diaminostilbene diphosphoric acid derivative, from the color developer.
**Sample No. 13 was prepared in the same manner as in Sample No. 11, except that the yellow colloidal silver was removed from Layer 5, and
***Sample No. 14 was prepared in the same manner as in Sample No. 11, except that sensitizing dye D-1 was replaced by D-9 in the yellow image-forming layer and D-2 by D-10 in the magenta image-forming layer, respectively.

D-9

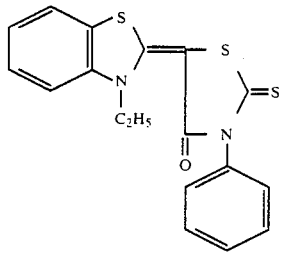

D-10

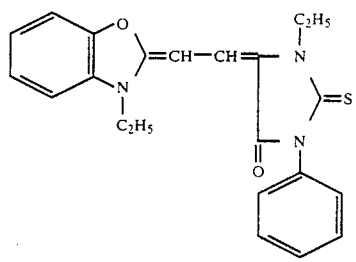

Developer A: 3-methyl-4-amino-N-ethyl-N-($\beta$-methanesulfonamidoethyl)-aniline sulfonamidoethyl)-aniline sulfate.
Developer B: 4-amino-N-ethyl-N-hydroxyethyl-aniline sulfate, i.e., Exemplified compound VI-2 represented by Formula VI, and
HBS-4: tricresyl phosphate.

In Sample No. 11, the distance of λmax values of the spectral sensitivities between the yellow image-forming layer and the magenta image-forming layer was 60 mm, and, in Sample No. 14, it was 70 mm.

It is found from Table 2 that the degrees of approximation between the hue of the resulted color proof and the hue of the printed image can be improved by processing a silver halide color photographic light-sensitive material for making a color proof, which contains a yellow coupler represented by Formula I, with a color developer containing a developing agent represented by Formula VI.

EXAMPLE 3

There prepared an emulsion comprising cubic silver bromide grains having an average grain-size of 0.3 μm by adding an equimolar aqueous silver nitrate solution and an aqueous potassium bromide solution at the same time into an aqueous gelatin solution at 50° C and taking 50 minutes in a double-jet precipitation method.

To the resulted emulsion, an aqueous silver nitrate solution and an aqueous solution containing sodium chloride and potassium bromide mixed together at a mole ratio of 1:1 were added at the same time. Thus, a cubic core/shell type emulsion whose grains are comprised of silver bromide cores and silver chlorobromide shells and have an average grain-size of 0.45 μm was prepared.

The coated samples were then prepared by making use of the above-mentioned silver halide emulsion in such a way as shown in Table-3.

TABLE 3

| Sample No. | Composition | (Coated amount) Unit: mg/dm$^2$ |
|---|---|---|
| Layer 8, UV absorbing layer | UV absorbent: UV-1 | 0.65 |
| | UV aborbent: UV-2 | 1.95 |
| | Solvent: HBS-2 | 1.0 |
| | Gelatin: | 7.8 |
| | Colloidal silica | 0.07 |
| Layer 7, Blue-sensitive layer | Silver Halide emulsion: | 4.4* |
| | Blue-sensitizing dye: D-11 | 200 mg/mol AgX |
| | Yellow coupler: See Table-4 | |
| | Solvent: See Table-4 | 8.2 |
| | Antistaining agent: AS-1 | 0.25 |
| | Antistaining agent: AS-2 | 0.25 |
| | Inhibitor: T-1 | 600 g/mol AgX |
| | Inhibitor: T-2 | 600 g/mol AgX |
| | Gelatin | 14.3 |
| Layer 6, Interlayer | Color-mixture preventive: AS-1 | 0.55 |
| | Solvent: HBS-2 | 0.72 |
| | Gelatin: | 5.4 |
| Layer 5, Yellow colloid layer | Yellow colloidal silver: | 1.05* |
| | Color-mixture preventive: AS-1 | 0.40 |
| | Solvent: HBS-2 | 0.49 |
| | Polyvinyl pyrolidone: | 0.47 |
| | Gelatin: | 9.2 |
| Layer 4, Interlayer | Color-mixture preventive: AS-1 | 0.55 |
| | Solvent: HBS-2 | 0.72 |
| | Gelatin: | 5.4 |
| Layer 3, Green-sensitive layer | Silver chlorobromide emulsion: | 3.30* |
| | Green-sensitizing dye: D-2 | 90 mg/mol AgX |
| | Magenta coupler: MC-1 | 2.4 |
| | Antistaining agent: AS-1 | 0.03 |
| | Antistaining agent: AS-2 | 0.19 |

TABLE 4

| Sample No. | Yellow cplr Kind | Amount added (mol/m²) | Oily matter Kind | Amount added (g/m²) | Dev.Agent Kind | Amount added (g/l) | Suitability for color proofing |
|---|---|---|---|---|---|---|---|
| Comp. 16 | YC-1 | $1.3 \times 10^{-3}$ | HBS-3 | 1.2 | A | 5.5 | Poor |
| Inv. 17 | I-2 | $1.3 \times 10^{-3}$ | II-2 | 0.9 | B | 5.5 | Good |
| Inv. 18 | I-3 | $1.3 \times 10^{-3}$ | III-69 | 0.9 | B | 5.5 | Excellent |
| Inv. 19 | I-8 | $1.3 \times 10^{-3}$ | III-69 | 0.9 | B | 5.5 | Excellent |
| Inv. 20 | I-36 | $1.3 \times 10^{-3}$ | II-2 | 0.7 | B | 5.5 | Good |

TABLE 3-continued

| Sample No. | Composition | (Coated amount) Unit: mg/dm² |
|---|---|---|
| | Solvent: HBS-2 | 3.15 |
| | Antiirradiation dye: AI-3 | 0.13 |
| | Inhibitor: T-1 | 600 mg/mol AgX |
| | Inhibitor: T-2 | 60 mg/mol AgX |
| | Gelatin: | 13.0 |
| Layer 2, Interlayer | Color-mixture preventive: AS-1 | 0.55 |
| | Solvent: HBS-2 | 0.72 |
| | Gelatin: | 7.5 |
| Layer 1, Red-sensitive layer | Silver halide emulsion: | 3.0 |
| | Red-sensitizing dye: D-3 | 45 mg/mol AgX |
| | Red-sensitizing dye: D-4 | 15 mg/mol AgX |
| | Cyan coupler: CC-1 | 2.08 |
| | Cyan coupler: CC-2 | 2.08 |
| | Antistaining agent: AS-2 | 0.15 |
| | Solvent: HBS-1 | 3.3 |
| | Antiirradiation dye: AI-4 | 0.09 |
| | Inhibitor: T-1 | 600 mg/mol AgX |
| | Inhibitor: T-2 | 60 mg/mol AgX |
| | Gelatin: | 13.8 |
| Support | Paper support laminated with polyethylene on both surface. Thickness was 14.0 μm. | |
| Back coat | Gelatin | (53) |
| | Colloidal silica | (6.0) |

*Coated amount is indicated in terms of silver.

D-11

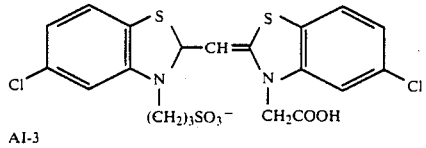

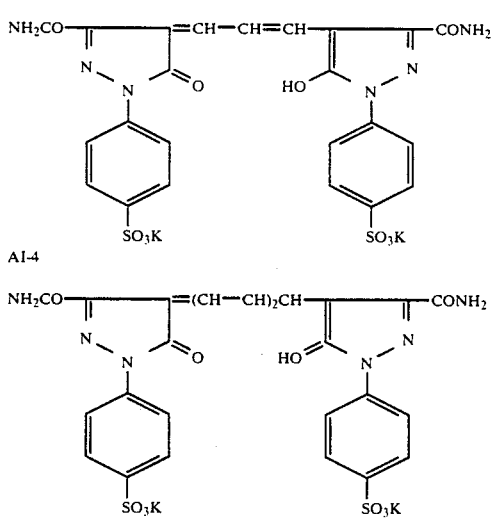

Exposures to light, processing manipulations, and spectral measurements of the samples were performed in the same way as in Example-2. The following results shown in Table-4 were obtained.

What is claimed is:

1. An image forming method comprising
a step for exposing a silver halide color photographic light-sensitive material which comprises at east three silver halide emulsion layers being different from each other in spectral sensitivity thereof, and at least one of said silver halide emulsion layers contains an yellow coupler represented by the following Formula I, to light through black and-white halftone dot images, and
a step for developing said silver halide color photographic light-sensitive material, after said exposing step, with a color developer containing a color developing agent represented by the following Formula V;

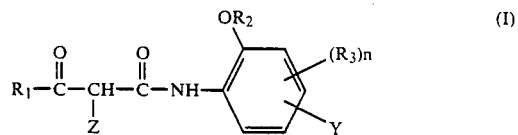

wherein $R_1$ represents an alkyl group or a cycloalkyl group; $R_2$ represents an alkyl group, a cycloalkyl group, an acyl group or an aryl group; $R_3$ represents a group substitutable with a benzene ring; n is an integer of zero or 1; Y represents a monovalent ballast group and Z represents a hydrogen atom or a group capable of being split off upon coupling reaction,

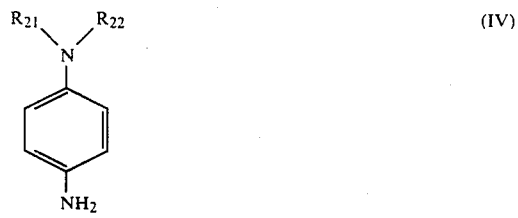

wherein $R_{21}$ and $R_{22}$ represent each an alkyl group provided that $R_{21}$ and $R_{22}$ may be the same or different from each other, and $R_{21}$ and $R_{22}$ may be bound together to complete a ring.

2. The method of claim 1, wherein the ballast group represented by Y is a group represented by -J-$R_{11}$, in which $R_{11}$ is a group having a carbonyl group or a sulfonyl group; and $R_{11}$ is a —CO— group, a —COO— group an $-\underset{\underset{R_{12}}{|}}{SO_2N}-$ group, $-\underset{\underset{R_{12}}{|}}{NSO_2}-$ group, a $-\underset{\underset{R_{12}}{|}}{NCO}-$ group or a $-\underset{\underset{R_{12}}{|}}{CON}-$ group, wherein $R_{12}$ is a hydrogen atom, an alkyl group or an aryl group.

3. The method of claim 1, wherein said silver halide photographic light-sensitive material contains a compound represented by Formula II or Formula III;

$$\begin{array}{c} R_4-O \\ R_5-O-P=O \\ R_6-O \end{array} \quad (II)$$

wherein $R_4$, $R_5$ and $R_6$ represent each an alkyl group or an aryl group, and at least two of the groups represented by said $R_4$, $R_5$ and $R_6$ are each an alkyl group having not more than 16 carbon atoms, $$R_7-(O)_p-\overset{\overset{O}{\|}}{\underset{\underset{(O)_r-R_9}{|}}{P}}-(O)_q-R_8 \quad (III)$$

wherein $R_7$, $R_8$ and $R_9$ represent each an aliphatic group or an aromatic group; and p, q and r are each an integer of 0 or 1, provided that the p, q and r are not 1 at the same time.

4. The method of claim 1, wherein the amount of silver contained in said silver halide emulsion layer containing said yellow coupler is within the range of from 200 mg/m² to 700 mg/m².

5. The method of claim 4, wherein said amount of silver is within the range of from 250 mg/m² to 500 mg/m².

6. The method of claim 1, wherein said developing step is performed in the presence of a fluorescent whitening agent.

7. The material of claim 1, wherein said silver halide photographic light-sensitive material has a filter layer containing a colloidal metal.

* * * * *